(12) United States Patent
Fujinawa et al.

(10) Patent No.: US 8,106,852 B2
(45) Date of Patent: Jan. 31, 2012

(54) DISPLAY DEVICE AND ELECTRONIC DEVICE

(75) Inventors: Nobuhiro Fujinawa, Yokohama (JP); Hirotake Nozaki, Port Washington, NY (US)

(73) Assignee: Nikon Corporation, Tokyo (JP)

( * ) Notice: Subject to any disclaimer, the term of this patent is extended or adjusted under 35 U.S.C. 154(b) by 799 days.

(21) Appl. No.: 11/666,623

(22) PCT Filed: Oct. 28, 2005

(86) PCT No.: PCT/JP2005/019922
§ 371 (c)(1),
(2), (4) Date: Jun. 6, 2007

(87) PCT Pub. No.: WO2006/049105
PCT Pub. Date: May 11, 2006

(65) Prior Publication Data
US 2008/0007486 A1 Jan. 10, 2008

(30) Foreign Application Priority Data

Nov. 4, 2004 (JP) ................. 2004-320096
Jan. 26, 2005 (JP) ................. 2005-017882
Mar. 3, 2005 (JP) ................. 2005-058593

(51) Int. Cl.
*G09G 5/00* (2006.01)
(52) U.S. Cl. ............................. 345/4; 349/69
(58) Field of Classification Search .......... 345/4–6; 349/69
See application file for complete search history.

(56) References Cited

U.S. PATENT DOCUMENTS

| 5,754,262 | A | * | 5/1998 | Lengyel ............... 349/104 |
| 6,954,239 | B2 | | 10/2005 | Kato et al. |
| 2002/0196387 | A1 | | 12/2002 | Kimura |
| 2003/0185191 | A1 | * | 10/2003 | Nagatomo et al. .......... 370/338 |
| 2004/0027518 | A1 | * | 2/2004 | Kato et al. ............... 349/113 |
| 2004/0252076 | A1 | | 12/2004 | Kodama |
| 2005/0219149 | A1 | | 10/2005 | Tuyls et al. |

FOREIGN PATENT DOCUMENTS

| DE | 44 09 087 A1 | 9/1995 |
| JP | A-11-231339 | 8/1999 |
| JP | A-2000-347184 | 12/2000 |
| JP | A-2001-092390 | 4/2001 |

(Continued)

OTHER PUBLICATIONS

Sep. 21, 2010 Supplementary European Search Report issued in European Patent Application No. 05 80 5366.

(Continued)

*Primary Examiner* — Kevin M Nguyen
*Assistant Examiner* — Cory Almeida
(74) *Attorney, Agent, or Firm* — Oliff & Berridge, PLC

(57) ABSTRACT

A display device includes: a first display unit that provides a light emitting display by individually controlling a light emitting quantity for each pixel; and a second display unit that allows either a transmitting state for transmitting ambient light or a reflecting state for reflecting the ambient light to be selected in correspondence to each pixel and brings up a display by assuming a specific combination of a transmitting area and a reflecting area, and the second display unit is layered over the first display unit so that the first display unit can be viewed through the transmitting area at the second display unit.

20 Claims, 27 Drawing Sheets

FOREIGN PATENT DOCUMENTS

| | | |
|---|---|---|
| JP | A 2002-14633 | 1/2002 |
| JP | A 2003-98541 | 4/2003 |
| JP | A-2003-098983 | 4/2003 |
| JP | A 2003-140114 | 5/2003 |
| JP | A 2004-45769 | 2/2004 |
| JP | A-2004-69926 | 3/2004 |
| JP | A 2004-125962 | 4/2004 |
| JP | A 2004-127662 | 4/2004 |
| JP | A-2004-245976 | 9/2004 |
| JP | A 2004-302321 | 10/2004 |
| JP | A-2004-341156 | 12/2004 |
| WO | WO 03/048849 A1 | 6/2003 |
| WO | WO 03/085632 A2 | 10/2003 |

OTHER PUBLICATIONS

Aug. 19, 2008 Office Action issued in Japanese Patent Application No. 2005-058593 (with translation).

Jul. 15, 2008 Office Action issued in Japanese Patent Application No. 2005-017882 (with translation).

Apr. 1, 2008 Office Action issued in Japanese Patent Application No. 2005-017882 (with translation).

Jul. 15, 2008 Office Action issued in Japanese Patent Application No. 2004-320096 (with translation).

Apr. 1, 2008 Office Action issued in Japanese Patent Application No. 2004-320096 (with translation).

* cited by examiner

FIG.10

(a)
NEWS
OCT. XX, 2004
YY IS BEING HELD AT XX THIS AFTERNOON. SEVERAL TENS OF PARTICIPANTS, INCLUDING MR. ZZ, ARE EXPECTED. A SEPARATE SEMINAR IS SCHEDULED, AND WE EXPECT A FAIR NUMBER OF PARTICIPANTS IN THIS SEMINAR AS WELL.

SIGN UP BY FAX AT XXX-YYY-XXX.

(b)
(BLACK)
_____

OCT. XX, 2004
···THIS AFTERNOON. SEVERAL TENS OF PARTICIPANTS, INCLUDING MR. ZZ, ARE EXPECTED. A SEPARATE SEMINAR IS SCHEDULED, AND WE EXPECT A FAIR NUMBER OF PARTICIPANTS IN THIS SEMINAR AS WELL.

SIGN UP BY FAX AT XXX-YYY-XXX.

(c)
(BLACK OVER THE ENTIRE SURFACE)
↓
(POWER OFF)

FIG.11
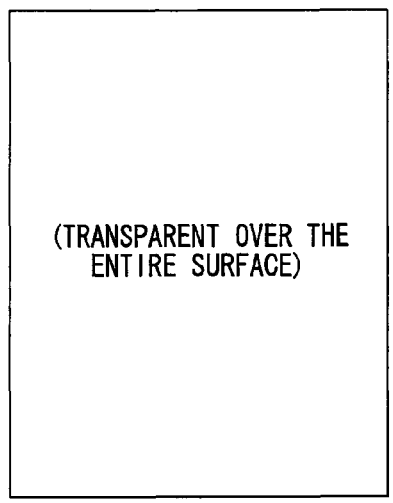
(a)
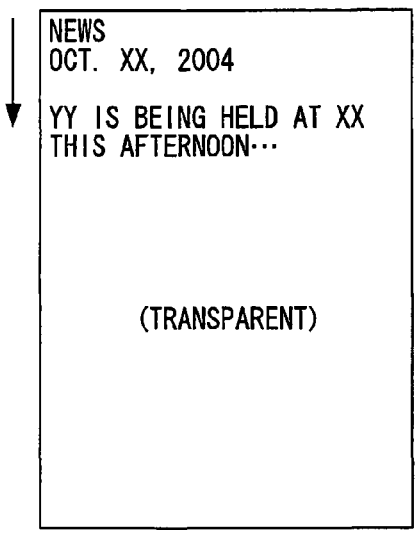
(b)
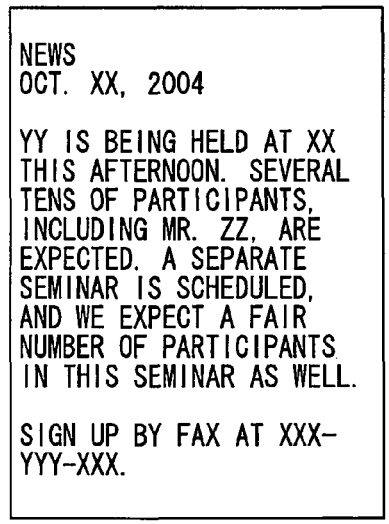
(c)

FIG.12

```
NEWS
OCT. XX, 2004

YY IS BEING HELD AT XX
THIS AFTERNOON. SEVERAL
TENS OF PARTICIPANTS,
INCLUDING MR. ZZ, ARE
EXPECTED. A SEPARATE
SEMINAR IS SCHEDULED, AND
WE EXPECT A FAIR NUMBER
OF PARTICIPANTS IN THIS
SEMINAR AS WELL.

SIGN UP BY FAX AT XXX-
YYY-XXX.
```

(a)

```
NEWS
OCT. XX, 2004

YY IS BEING HELD AT XX
THIS AFTERNOON. SEVERAL
TENS OF PARTICIPANTS,
INCLUDING MR. ZZ, ARE
EXPECTED. A SEPARATE
SEMINAR IS SCHEDULED,
AND WE EXPECT A FAIR
NUMBER OF PARTICIPANTS
IN THIS SEMINAR AS WELL.

SIGN UP BY FAX AT XXX-
YYY-XXX.
```

(b)

```
(BLACK OVER THE ENTIRE
       SURFACE)
          ↓
      (POWER OFF)
```

X (DAY) X (MONTH), 2004

14:20

(POWER OFF STATE)

FIG.20

| File | Date | Time |
| --- | --- | --- |
| DSCN0034.JPG | 7/x | 10:20 |
| DSCN0035.JPG | 7/x | 10:22 |
| DSCN0036.JPG | 7/x | 11:55 |
| DSCN0037.JPG | 7/x | 13:04 |

→ ⏻

(a) (b) (c)

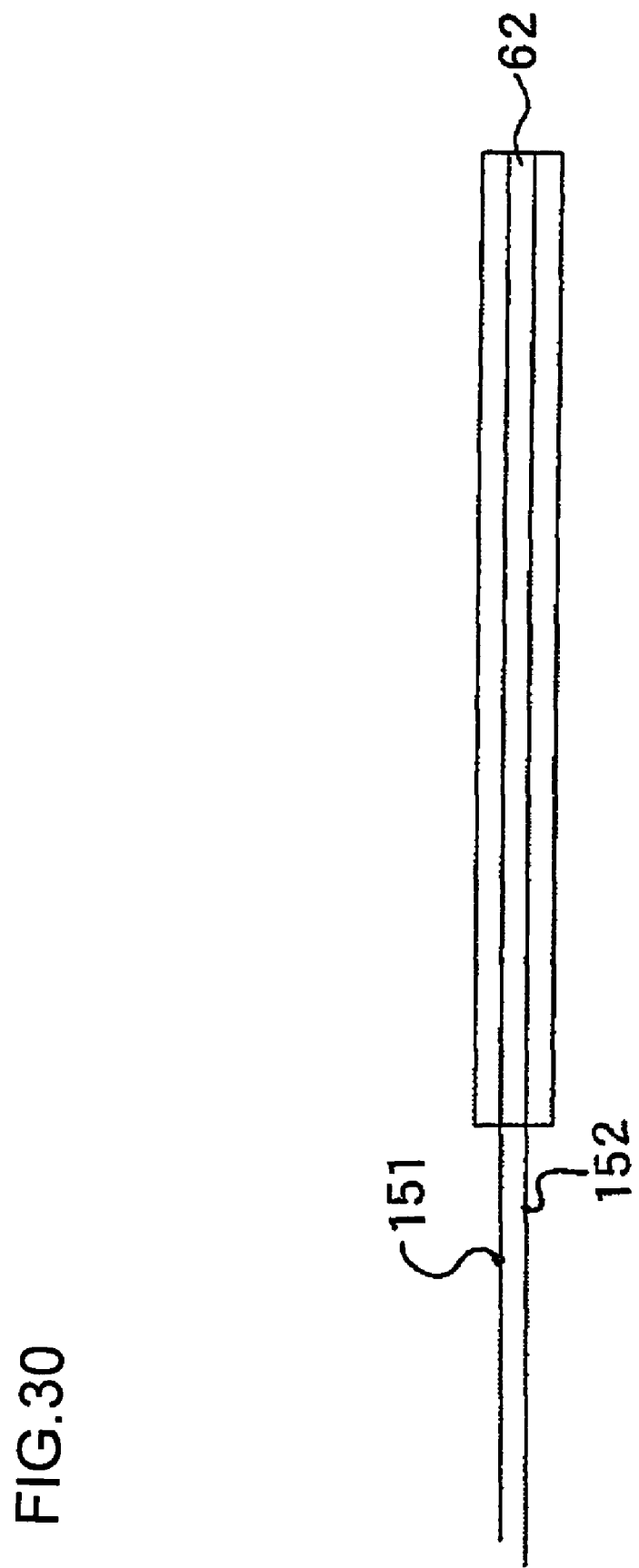

DISPLAY DEVICE AND ELECTRONIC DEVICE

TECHNICAL FIELD

The present invention relates to a display device capable of displaying an image or characters and an electronic device at which such a display device is mounted.

BACKGROUND ART

Thin display devices, mounted at electronic devices such as portable telephones, digital cameras and PDAs, are utilized in a wide range of applications. At a display device equipped with a nematic liquid crystal element, an image formed at the transmission-type liquid crystal element in which the transmittance is controlled for each pixel becomes visible as the liquid crystal element is illuminated from the rear. Since the liquid crystal element itself does not emit light, the display device requires an illuminating member (e.g., a backlight) for illuminating the liquid crystal element. There is also a display device known in the related art that includes an organic EL (electroluminescence) element that emits light in place of a liquid crystal element and thus does not require a backlight member. Structures that may be adopted in such liquid crystal display devices and organic EL display devices are disclosed in, for instance, patent reference 1 and patent reference 2.

In addition, there are display devices achieved by using cholesteric liquid crystals and PN (polymer network) liquid crystals, which are utilized in so-called electronic paper or an Electronic Book (registered trademark) (see, for instance, patent reference 3 and patent reference 4). Such a display device, in which ambient light is used as illuminating light, adopts a structure that allows individual pixels constituting the liquid crystal element to be switched to a transmitting state or a reflecting state. The ambient light is reflected and diffused at a pixel switched to the reflecting state and shows up as a white glow at, for instance, a PN liquid crystal, whereas the ambient light is transmitted through a pixel switched to the transmitting state. If the liquid crystal element includes an absorbing layer such as a black layer for absorbing the ambient light disposed under the liquid crystal, this pixel is visually recognized as a black area. Since no light is emitted, this type of display device does not need to consume a great deal of power.

Patent reference 1: Japanese Laid Open Patent Publication No. 2004-125962
Patent reference 2: Japanese Laid Open Patent Publication No. 2004-127662
Patent reference 3: Japanese Laid Open Patent Publication No. 2003-140114
Patent reference 4: Japanese Laid Open Patent Publication No. 2003-98541

DISCLOSURE OF THE INVENTION

Problems to be Solved by the Invention

While the light emitting-type display device described above is capable of providing a display with a rich tonal expression and also assures a high drawing speed, it needs to emit light at a backlight member or at the element itself and thus is bound to consume a great deal of power. A display device that uses ambient light, on the other hand, is capable of sustaining a display state without requiring a great deal of power. However, its drawing speed is low, since it takes a considerable length of time to switch from the transmitting state to the reflecting state and vice versa. Accordingly, there is a need for a display device capable of drawing images quickly while minimizing the power consumption.

Means for Solving the Problems

According to the 1st aspect of the present invention, a display device comprises: a first display unit that provides a light emitting display by individually controlling a light emitting quantity for each pixel; and a second display unit that allows either a transmitting state for transmitting ambient light or a reflecting state for reflecting the ambient light to be selected in correspondence to each pixel and brings up a display by assuming a-specific combination of a transmitting area and a reflecting area, and the second display unit is layered over the first display unit so that the first display unit can be viewed through the transmitting area at the second display unit.

According to the 2nd aspect of the present invention, in the display device according to the 1st aspect, it is preferred that when a display is brought up at the first display unit, an area of the second display units corresponding to a display area at the first display unit at least is set as the transmitting area at the second display unit.

According to the 3rd aspect of the present invention, in the display device according to the 1st aspect, it is preferred that when a display is brought up at the second display unit, all pixels at the first display unit corresponding to a display area at the second display unit are set in a non-emitting state at the first display unit.

According to the 4th aspect of the present invention, in the display device according to the 1st aspect, it is preferred that when a display is brought up at the second display unit, pixels at the first display unit corresponding to a specific area containing the transmitting area in a display area of the second display unit are set in an emitting state and other pixels are set in a non-emitting state at the first display unit.

According to the 5th aspect of the present invention, in the display device according to the 3rd or the 4th aspect, it is preferred that when a display is brought up over the display area of the second display unit and a display is brought up over another display area at the first display unit simultaneously, an area at the second display unit, which corresponds to the other display area at the first display unit, is set as the transmitting area.

According to the 6th aspect of the present invention, in the display device according to the 1st aspect, it is preferred that: there is further provided a display control unit that selects either the first display unit or the second display unit in correspondence to specific conditions; when the first display unit is selected, the second display unit sets at least an area thereat corresponding to a display area of the first display unit as a transmitting area; and when the second display unit is selected, the first display unit sets pixels corresponding to the reflecting area at the second display unit in a non-emitting state.

According to the 7th aspect of the present invention, in the display device according to the 6th aspect, it is preferred that: there is further provided a detection unit that detects display contents; and the display control unit selects either the first display unit or the second display unit based upon detection results provided by the detection unit.

According to the 8th aspect of the present invention, in the display device according to the 6th aspect, it is preferred that: there is further provided a detection unit that detects brightness in a surrounding environment; and the display control unit selects the second display unit if the detection unit detects a brightness level equal to or higher than a predetermined brightness level and selects the first display unit if the detection unit detects a brightness level lower than the predetermined brightness level.

According to the 9th aspect of the present invention, in the display device according to the 6th aspect, it is preferred that: there is further provided a detection unit that detects a level of remaining battery power; and the display control unit selects the first display unit if the detection unit detects the remaining battery power equal to or greater than a predetermined level and selects the second display unit if the detection unit detects the remaining battery power less than the predetermined level.

According to the 10th aspect of the present invention, in the display device according to the 1st aspect, it is preferred that: there is further provided a display control unit that controls display at the first display unit and display at the second display unit; and the display control unit (1) issues a drawing instruction for the first display unit and also issues an instruction for the second display unit to set at least pixels corresponding to a drawing area at the first display unit in the transmitting state at the second display unit, (2) issues a drawing instruction for the second display unit with identical contents to those in the drawing instruction for the first display unit except for at least a display color, and also issues an instruction for the first display unit to draw a specific color at pixels at the first display unit corresponding to a drawing area at the second display unit in synchronization with a drawing speed at the second display unit, and (3) stops display control on at least the first display unit after drawing at the second display unit ends.

According to the 11th aspect of the present invention, in the display device according to the 1st aspect, it is preferred that: there is further provided a display control unit that controls display at the first display unit and display at the second display unit; and the display control unit (1) issues a drawing instruction for the first display unit and also issues an instruction for the second display unit to set a least pixels corresponding to a drawing area at the first display unit in the transmitting state at the second display unit, (2) issues a drawing instruction for the second display unit with identical contents to those in the drawing instruction for the first display unit, and (3) stops display control on at least the first display unit after drawing at the second display unit ends.

According to the 12th aspect of the present invention, in the display device according to any one of the 1st through 11th aspects, it is preferred that the first display unit includes a liquid crystal element constituting a display element thereof and provides the light emitting display by using a backlight.

According to the 13th aspect of the present invention, in the display device according to any one of the 1st through 11th aspects, it is preferred that the first display unit includes an electroluminescence element constituting a display element thereof.

According to the 14th aspect of the present invention, in the display device according to any one of the 1st through 13th aspects, it is preferred that the first display unit provides a color display.

According to the 15th aspect of the present invention, in the display device according to any one of the 1st through 14th aspects, it is preferred that the second display unit includes a display element capable of sustaining a display in the power OFF state.

According to the 16th aspect of the present invention, in the display device according to the 15th aspect, it is preferred that the second display unit includes a cholesteric liquid crystal element constituting a display element thereof.

According to the 17th aspect of the present invention, in the display device according to any one of the 1st through 14th aspect, it is preferred that the second display unit includes a polymer network liquid crystal constituting a display element thereof.

According to the 18th aspect of the present invention, in the display device according to any one of the 1st through 11th aspect, it is preferred that: the first display unit includes an active drive-type display element; the second display unit includes a passive drive-type display element; and drawing speed at the second display unit is lower than the drawing speed at the first display unit.

According to the 19th aspect of the present invention, in the display device according to the 10th or the 11th aspect, it is preferred that: there is further provided an illuminating unit that illuminates the first display unit; and the display control stop includes turning off the illuminating unit.

According to the 20th aspect of the present invention, in the display device according to the 10th or the 11th aspect, it is preferred that: the first display unit includes a light generating display element; and the display control stop includes cutting off power to the first display unit.

According to the 21st aspect of the present invention, in the display device according to any one of the 18th through 20th aspects, it is preferred that the second display unit holds control on the transmitting state and the reflecting state having been set for individual pixels even after power supply stops.

According to the 22nd aspect of the present invention, an electronic device comprises: a display device according to the 1st aspect; and a display control unit that controls display at the first display unit and display at the second display unit.

According to the 23rd aspect of the present invention, in the electronic device according to the 22nd aspect, it is preferred that the display control unit enables at least the first display unit to provide display when the electronic device is in a power ON state, whereas the display control unit disallows display at the first display unit and enables the second display unit to provide display when the electronic device is in the power OFF state.

According to the 24th aspect of the present invention, in the electronic device according to the 23rd aspect, it is preferred that the display control unit controls power supply so as to supply power to the second display unit in the power OFF state when updating display contents at the second display unit.

According to the 25th aspect of the present invention, in the electronic device according to the 23rd aspect, it is preferred that the display control unit engages the first display unit for display in the power ON state and provides display by switching to the second display unit in response to the power OFF operation.

According to the 26th aspect of the present invention, in the electronic device according to the 24th or the 25th aspect, it is preferred that the display control unit switches to the first display unit for display in response to a power ON operation performed while a display is up at the second display unit.

According to the 27th aspect of the present invention, in the electronic device according to the 22nd aspect, it is preferred that the display control unit switches to the second display unit for display when the electronic device remains unoperated over a predetermined length of time with a display up at the first display unit.

According to the 28th aspect of the present invention, in the electronic device according to the 22nd aspect, it is preferred that the display control unit switches to the first display unit for display if any operation is performed while a display is up at the second display unit.

According to the 29th aspect of the present invention, in the electronic device according to the 22nd aspect, it is preferred that: there is further provided a setting unit with which an operating mode is selected; and the display control unit switches to the first display unit or the second display unit to be engaged for display at the display device in correspondence to the operating mode selected via the setting unit.

According to the 30th aspect of the present invention, in the electronic device according to the 22nd aspect, it is preferred that the display control unit switches to the first display unit or the second display unit to be engaged for display at the display device in correspondence to display content to be displayed at the display device.

According to the 31st aspect of the present invention, in the electronic device according to the 22nd aspect, it is preferred that the display control unit disallows display at the second display unit and enables the first display unit to provide display during a preset time block and allows either the first display unit or the second display unit to be engaged for display during a remaining time block.

According to the 32nd aspect of the present invention, in the electronic device according to any one of the 22nd through 31st aspects, it is preferred that display contents to be displayed at the first display unit include an image.

According to the 33rd aspect of the present invention, in the electronic device according to any one of the 22nd through 32nd aspects, it is preferred that display contents to be displayed at the second display unit include at least one of; a date, a time, a level of remaining battery power, menu information and user input information.

According to the 34th aspect of the present invention, in the electronic device according to any one of the 22nd through 32nd aspects, it is preferred that: there is further provided a photographing unit that photographs a subject; and display contents to be displayed at the second display unit include at least one of; photographing history, photographing conditions and a photographed image.

According to the 35th aspect of the present invention, in the electronic device according to any one of the 22nd through 32nd aspects, it is preferred that: there is further provided a communication unit that engages in communication with a device outside the electronic device; and display contents to be displayed at the second display unit include information obtained through the communication conducted by the communication unit.

According to the 36th aspect of the present invention, in the electronic device according to the 33rd or the 35th aspect, it is preferred that the display control unit updates the display contents displayed at the second display unit with predetermined time intervals.

According to the 37th aspect of the present invention, in the electronic device according to any one of the 22nd through 36th aspects, it is preferred that the display at the second display unit can be sustained without using any power as long as display contents thereof remain unchanged.

According to the 38th aspect of the present invention, in the electronic device according to any one of the 22nd through 37th aspects, it is preferred that color display can be provided at the first display unit.

Advantageous Effect of the Invention

The display device according to the present invention includes the first display unit that provides a light emitting display by individually controlling the light emitting quantity at each pixel and the second display unit that allows each pixel to be individually set to a transmitting state in which ambient light is transmitted or a reflecting state in which the ambient light is reflected. The second display unit is layered over the first display unit so as to allow the first display unit to be viewed through a transmission area at the second display unit. Thus, an optimal display unit better suited to specific display contents or the like can be selected and used and ultimately, power can be consumed more efficiently. In addition, the first display unit can be used as an absorptive layer needed in conjunction with the second display unit. In other words, since the display device does not need to include a special absorptive layer, the number of required parts can be reduced. Furthermore, since the two display units are layered one on top of the other, they can be installed in a space that is hardly any larger than the space required for installing a single display unit.

BEST MODE FOR CARRYING OUT THE INVENTION

First Embodiment

Figure 13:
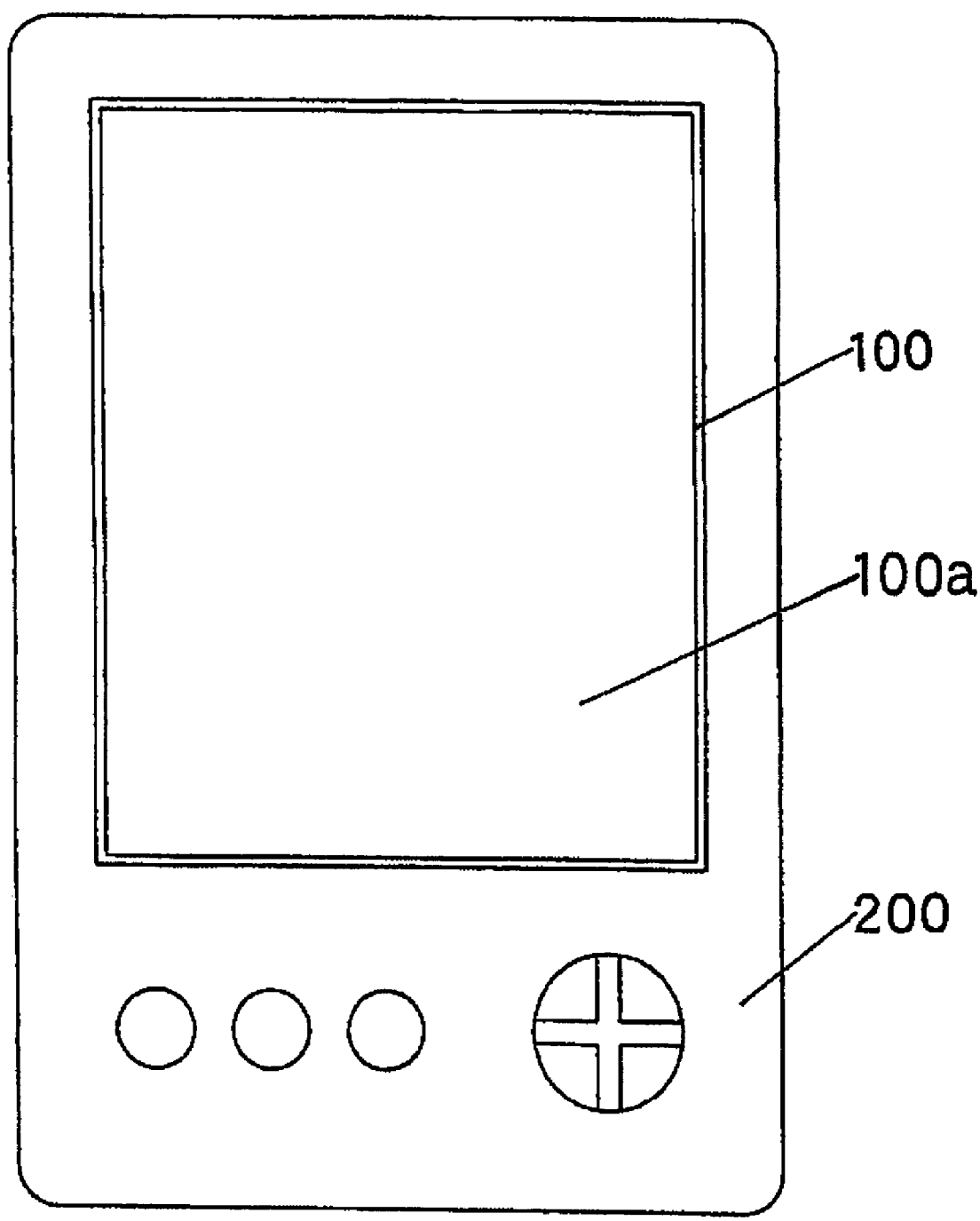

The following is an explanation of the best mode for carrying out the invention, given in reference to the drawings. A display device 100 achieved in the first embodiment of the present invention is mounted at an electronic device (electronic instrument) such as a PDA 200 as shown in FIG. 13, or a portable telephone, a digital camera or an Electronic Book viewer (none shown).

Figure 1:
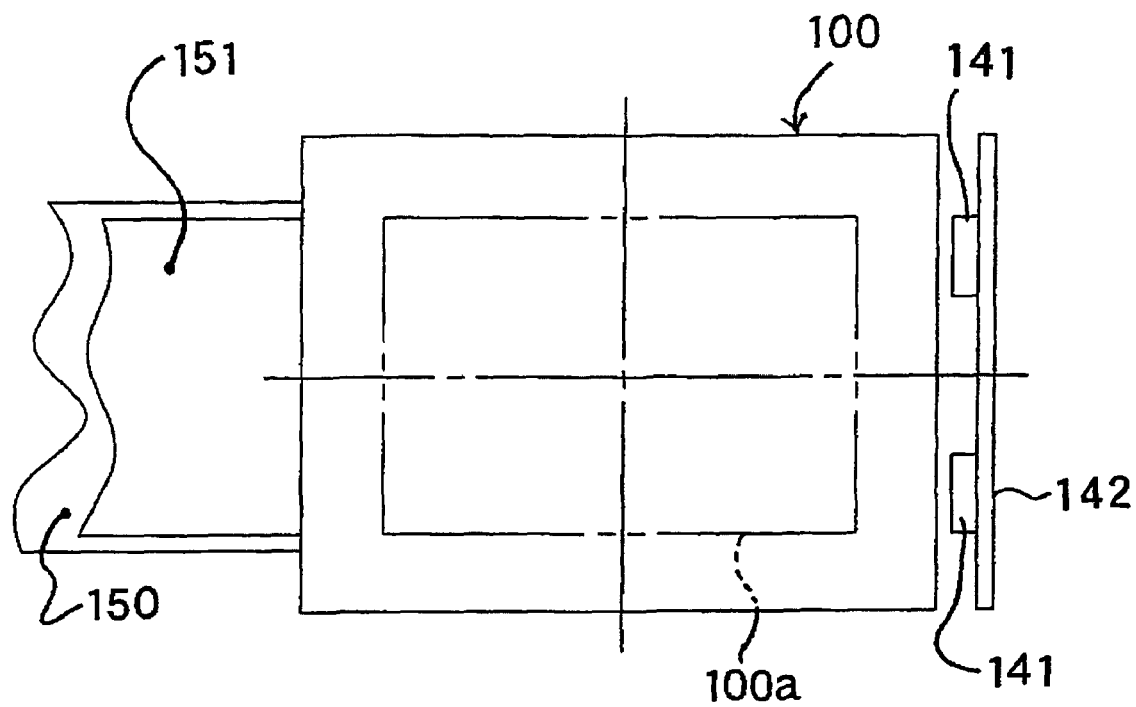
FIG. 1 A front view showing the structure adopted in the display device
Figure 2:
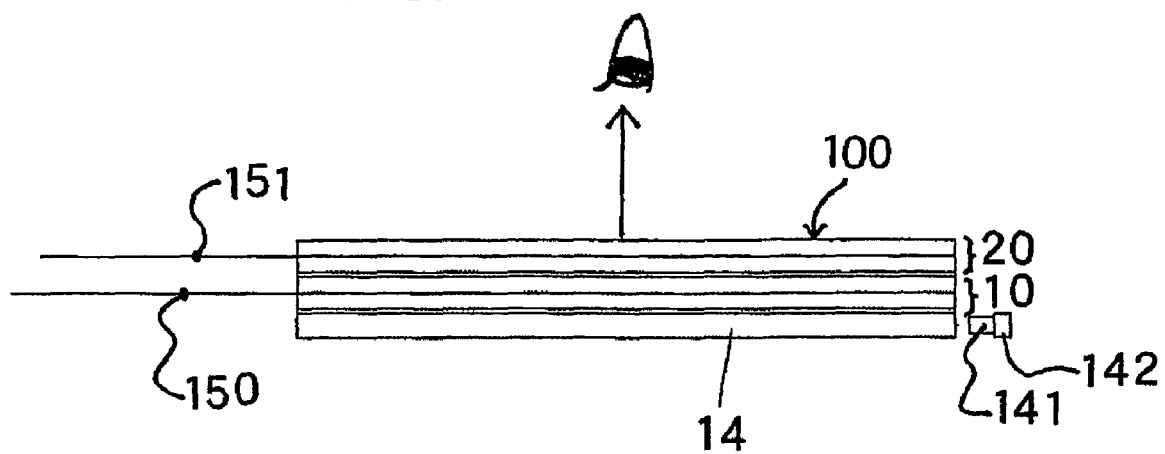
FIG. 2 A side elevation showing the structure adopted in the display device

FIGS. 1 and 2 illustrate the structure adopted in the display device 100 respectively in a front view and a side elevation. As shown in FIG. 1, the display device 100 includes an effective display area 100a where an image, text or the like is displayed.

As shown in FIG. 2, the display device 100 comprises a first display module 10 and a second display module 20 layered over the first display module. The two layered display modules 10 and 20 are illuminated by a backlight member from the side where the first display module 10 is present. The backlight member is constituted with a high-intensity white LED 141, an LED substrate 142 at which the white LED 141 is mounted and a light guiding plate 14. The light guiding plate 14 ranges over an area greater than at least the effective display area 100a. Light having been emitted from the white LED 141 and having entered the light guiding plate 14 from a side surface (the right side in FIGS. 1 and 2) of the light guiding plate 14 is converted to planar illuminating light achieving a uniform brightness within the effective display area 100a and the first display module 10 is illuminated with this planar illuminating light. The user is able to observe the displayed image from above in FIG. 2.

Display data, drive signals and the like are provided to the first display module 10 and the second display module 20 from the corresponding display control circuits to be detailed later respectively via flexible wiring substrates 150 and 151.

Figure 3:
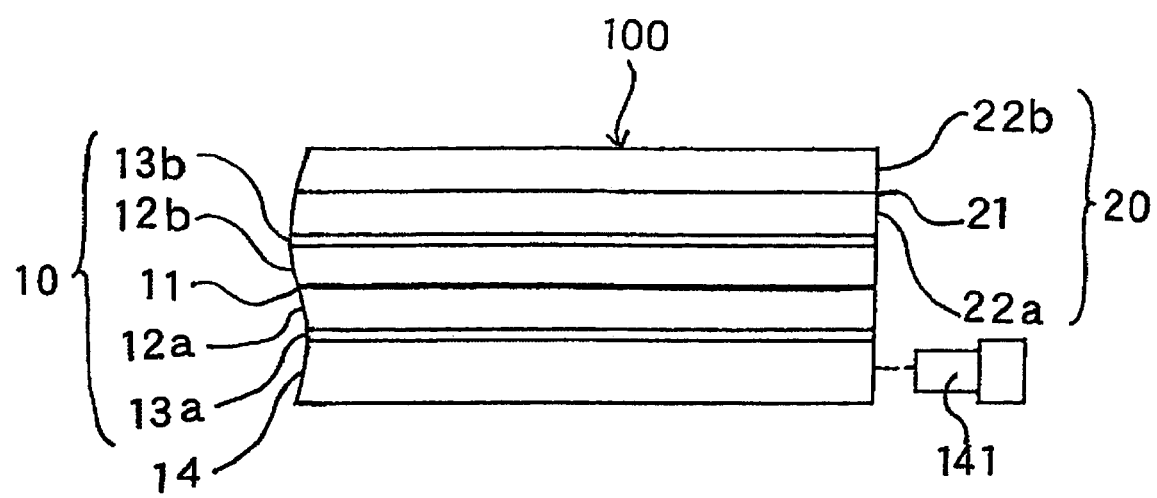
FIG. 3 A partial enlargement of FIG. 2

FIG. 3 illustrates the internal structure adopted in the display device 100 in a partial enlargement of FIG. 2. FIG. 3 shows the first display module 10 constituted with a liquid crystal panel of the known art adopting, for instance, a TFT method. A liquid crystal 11 is sealed between two glass substrates 12a and 12b, with a first polarizing plate 13a and a second polarizing plate 13b disposed so as to hold the glass substrates 12a and 12b between the polarizing plates. The direction along which light passing through the second polarizing plate 13b is polarized and the direction along which light passing through the first polarizing plate 13a is polarized are offset from each other by 90°. In addition, a color filter (not shown) is disposed between the glass substrate 12b and the second polarizing plate 13b.

When no voltage is applied from a transparent electrode (not shown) disposed on the inner side of the glass substrate 12, the liquid crystal 11, assuming a specific arrangement (orientation) for the liquid crystal molecules within the liquid crystal layer, rotates the polarizing direction along which light having entered the liquid crystal layer is polarized by 90°. Thus, the polarized light having entered the liquid crystal 11 via the first polarizing plate 13a is first rotated by 90° within the liquid crystal layer, passes through the second polarizing plate 13b and exits the first display module 10 to enter the second display module 20.

As a voltage is applied from the transparent electrode (not shown), the liquid crystal 11 assumes a different liquid crystal molecule arrangement in the liquid crystal layer and the polarizing direction for the incident light is no longer rotated by 90°. Thus, the polarized light having entered the liquid crystal 11 via the first polarizing plate 13a can no longer pass through the second polarizing plate 13b and the quantity of transmitted light exiting the first display module becomes reduced. Since the extent to which the liquid crystal molecule arrangement changes is in proportion to the voltage applied from the transparent electrode, the rate of rotation of the polarizing direction for light advancing through the liquid crystal layer, too, is in proportion to the voltage applied. Accordingly, the quantity of light transmitted through the first display module 10 to enter the second display module 20 decreases as the level of the voltage applied to the liquid crystal 11 increases.

The liquid crystal 11 adopts a structure that allows a given voltage corresponding to a drive signal provided from a display control circuit (to be detailed later) based upon image signals to be applied to each of specific areas (pixels) separated from one another so as to achieve a matrix pattern. Thus, an optical image generated via the first display module 10 based upon the image signals enters the second display module 20. This display method, which enables individual control of the transmittance of the illuminating light, i.e., the quantity of modulated light to be emitted, in correspondence to each pixel, assures rich tonal expression in the display. In addition, since the light is transmitted through the color filter as explained earlier, the display method is ideal for a full-color display of a photographic image or a dynamic image.

The second display module 20 is constituted with a liquid crystal panel with a cholesteric liquid crystal 21 sealed between two glass substrates 22a and 22b. The cholesteric liquid crystal 21 adopts a structure that allows a given voltage corresponding to a drive signal provided from a display control circuit (to be detailed later) based upon an image signal to be applied to each of specific areas (pixels) separated from one another so as to achieve a matrix pattern. As a voltage is applied to the liquid crystal 21 from the transparent electrode, a change over between the transmitting state and the reflecting state occurs.

A pixels switched to the reflecting state diffuses and reflects the ambient light and are thus seen by the user as, for instance, a yellowish glow. A pixel switched to the transmitting state, on the other hand, allows the optical image generated at the first display module 10 to be transmitted and the user is able to view the color image displayed at the first display module 10. Since the cholesteric liquid crystal has a retentive property which allows it to function as a memory, it sustains the reflecting state (or the transmitting state) even when the power supply to the second display module 20 stops.

The effective display area 100a of the display device 100 corresponds to the effective display area of the first display module 10, whereas the second display module 20 has an effective display area greater than, at least, the effective display area 100a. The light guiding plate 14, the first display module 10 and the second display module 20 are stacked one on top of the other in substantially close contact with one another, and together they constitute the display device 100.

Figure 4:
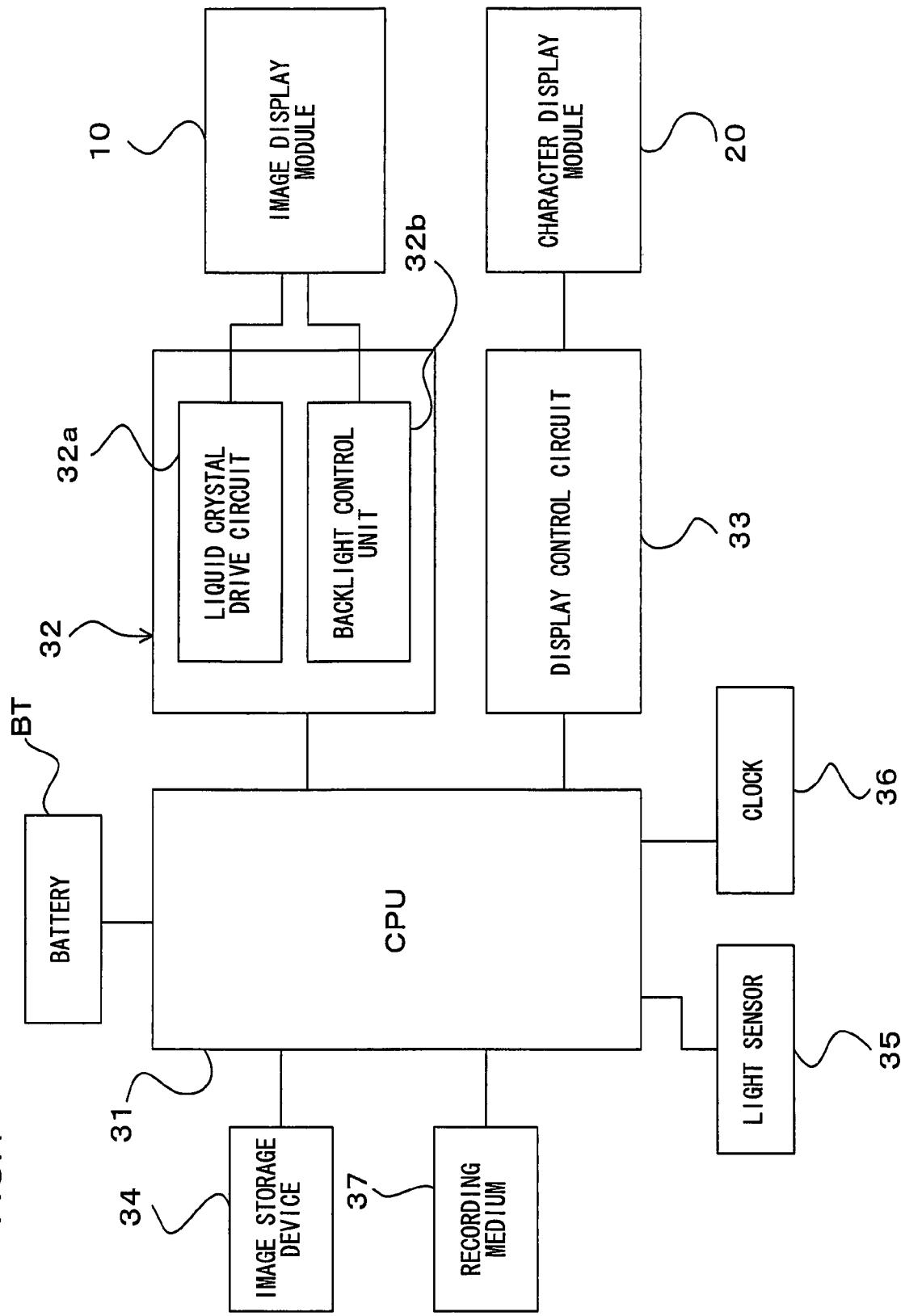
FIG. 4 A control block diagram of the display device

FIG. 4 is a control block diagram of the display device 100. From a battery BT, power is supplied to various blocks including a CPU 31. The drive of the first display module 10 is controlled by a display control circuit 32. The display control circuit 32 includes a liquid crystal drive circuit 32a that drives the liquid crystal 11 via the transparent electrode and a backlight control unit 32b that executes on/off control for the white LED 141. The drive of the second display module 20 is controlled by a display control circuit 33. The display control circuit 33 drives the liquid crystal 21 via a transparent electrode. In addition to transmitting a liquid crystal drive command together with display data to the display control circuits 32 and 33, the CPU 31 reads out image data and character data from an image storage device 34 or a recording medium 37 and writes image data and character data into the image storage device 34 or the recording medium 37. A light sensor 35 detects the level of brightness around the display device 100 and outputs a detection signal to the CPU 31. A clock circuit 36 generates time point information by dividing a clock signal. The image storage device 34 may be constituted with, for instance, a hard disk device. The recording medium 37 may be a detachable memory card.

Display modes that may be assumed in the display device 100 structured as described above are now explained.

(Image Display)

Figure 5:
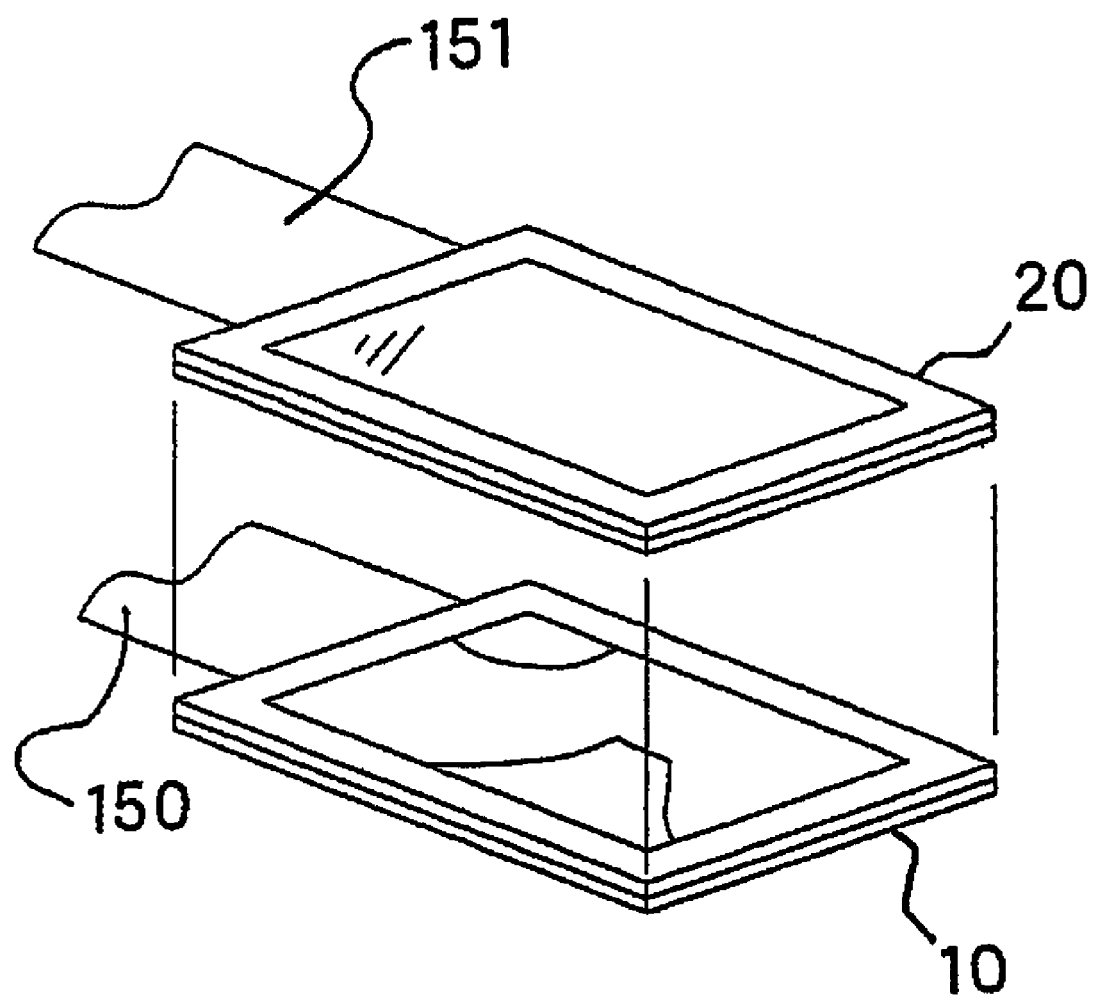
FIG. 5 An illustration showing how an image is displayed

When displaying a reproduced (replayed) image at the display device 100 by using image data recorded in the image storage device 34 or the recording medium 37, the white LED 141 is turned on, the reproduced image is displayed at the first display module 10 and all the pixels at the second display module 20 are set in the transmitting (transparent) state as shown in FIG. 5. The user observes the display image formed with display light emitted from the first display module 10 through the second display module 20 in the transmitting state. If the second display module 20 has a memory property for display retention (the current state is sustained after the power supply stops), the power supply to the second display module 20 is stopped after all the pixels at the second display module are switched to the transmitting state and the transmitting state is sustained at the second display module 20. Thus, a still image brought up at the display device 100 is held on display simply by setting all the pixels at the second display module in the transmitting (transparent) state and supplying power to the first display module 10. The first display module 10 may be referred to as an image display module.

(Text Display)

Figure 6:
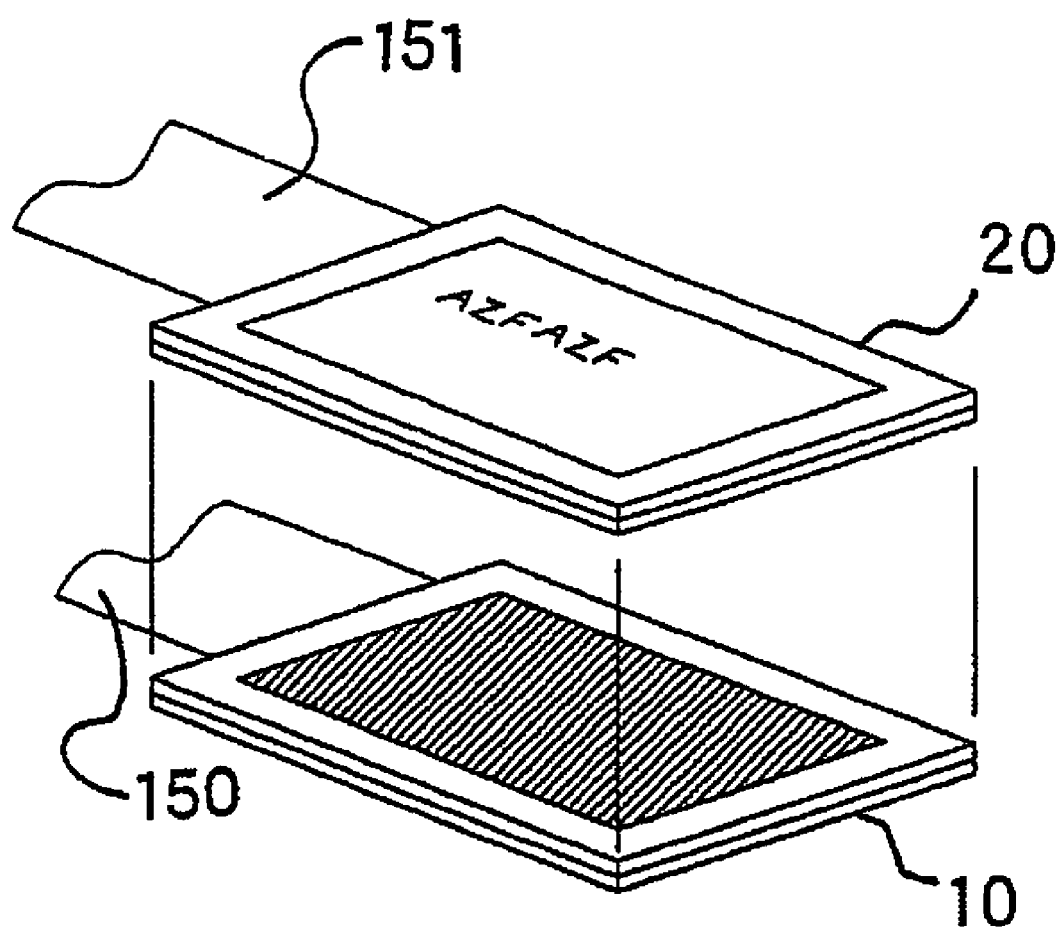
FIG. 6 An illustration showing how characters are displayed

When displaying characters or the like at the display device 100, areas (pixels) corresponding to the characters to be brought up on display at the second display module 20 are set in the transmitting state with the other areas (pixels) set in the reflecting state and the drive of the liquid crystal 11 at the first display module 10 is stopped with the power supply thereto also stopped to turn off the LED 141, as shown in FIG. 6. As the power supply is cut off, all the pixels at the first display module 10 are set in a non-emitting state, i.e., all the pixels turn black, and thus, light transmitted through the transmitting areas (character areas) at the second display module 20 is absorbed over the black area. As a result, the user is able to view black characters displayed against a yellow base. Since the first display module 10 in the power OFF state functions as an absorptive layer for the second display module 20, the need for a special black layer or the like to constitute an absorptive layer is eliminated. By reversing the settings above, i.e., by setting the areas (pixels) corresponding to the characters to be displayed at the second display module 20 in the reflecting state with the remaining areas (pixels) set in the transmitting state, turning off the LED 141 and setting all the pixels at the first display module 10 in the non-emitting state to turn them black, yellow characters can be viewed against a black base. The second display module 20 may be referred to as a character display module.

As described above, the second display module 20 holds the transmitting state or the reflecting state after the power supplied thereto is cut off and, as a result, the power supply to both the first display module 10 and the second display module 20 can be turned off to minimize the power consumption as long as the display contents do not need to be updated.

(Combined Display)

Figure 7:
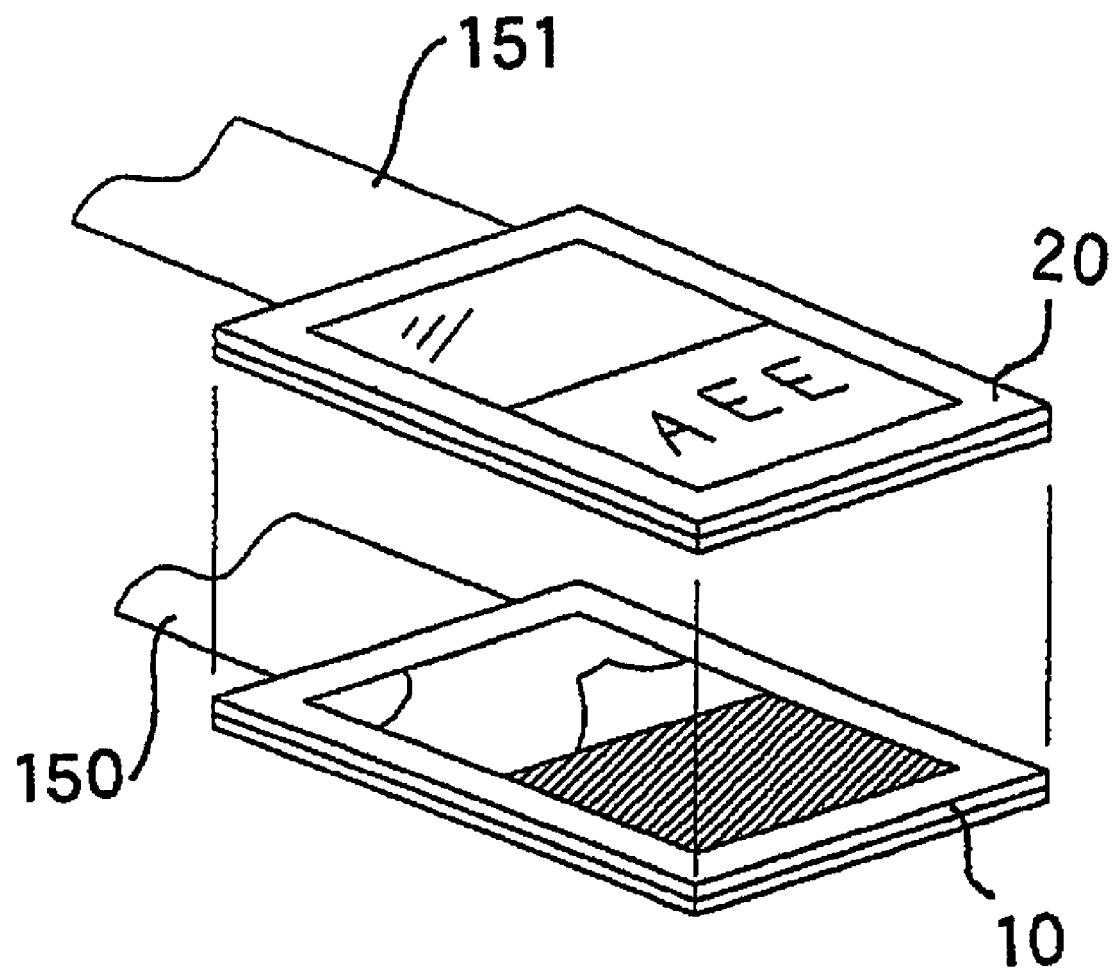
FIG. 7 An illustration showing how a combined display is provided

When displaying an image over part of the effective display area 100a and, at the same time, displaying characters over another part of the display area 100a at the display device 100, the image may be displayed at the upper half of the first display module 10 with the lower half thereof set in a black display state and the white LED 141 set in an ON state, as shown in FIG. 7. In this case, the upper half of the second display module 20 should be set in the transmitting state, the areas (pixels) corresponding to the characters in the lower half should be also set in the transmitting state and the non-character areas (pixels) in the lower half should be set in the reflecting state. In this display mode, the user is able to view the reproduced image displayed via the first display module 10 over the upper half of the screen through the transmitting area of the second display module 20 and also view the characters (black characters against a yellow base) displayed via the second display module 20 over the lower half of the screen.

It is to be noted that if the first display module 10 is constituted with a light emitting element capable of generating light, such as an organic EL element, the power supply to the lower half of the first display module 10 can be turned off and, as a result, the power consumption at the first display module 10 can be halved compared to the power consumption required for a similar display provided by engaging the first display module alone. It is also to be noted that the combination ratio with regard to the ratio of the image display area and the character display area, the number, the position and the sizes of the individual display areas and the like can be adjusted freely in the combined display mode.

(Color Character Display)

Figure 8:
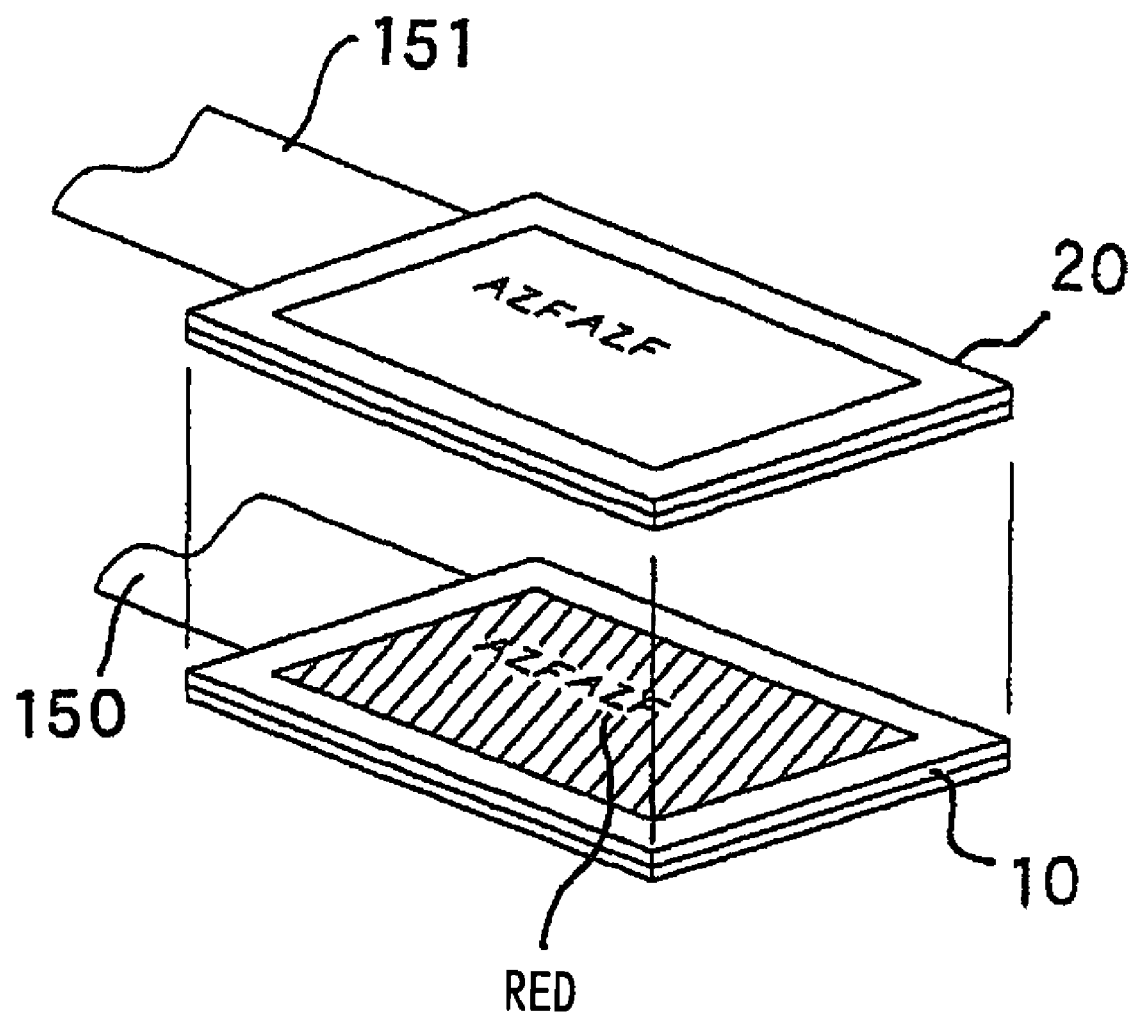
FIG. 8 An illustration showing how characters are displayed in color

Text characters can be displayed in, for instance, red at the display device 100 by setting the areas (pixels) corresponding to the characters to be displayed at the second display module 20 in the transmitting state and setting the non-character areas (pixels) at the second display module 20 in the reflecting state, as shown in FIG. 8. In this case, areas corresponding to the characters (or a specific area containing the character areas) are set in a red color display state, the remaining area is set in a black color display state and the white LED 141 is turned on at the first display module 10. The red color display at the first display module 10 can be viewed by the user through the transmitting areas (character pixels) at the second display module 20. Namely, red characters are displayed against the yellow base at the display device 100.

It is to be noted that by setting the areas corresponding to the characters (or a specific area containing the character areas) in a blue display state, a green display state or the like at the first display module 10, the characters can be displayed in a color other than red. In addition, characters assuming colors different from one another can also be displayed.

(Display Module Selection)

The CPU 31 adopts a structure that enables it to automatically select an optimal display mode among the display modes shown in FIGS. 5 through 7 in correspondence to the contents to be brought up on display. For instance, if the display contents are a color image such as a still image, a dynamic image or an animation, the CPU 31 automatically selects the display mode shown in FIG. 5. If the display contents are text or simple icons, the CPU 31 automatically selects the display mode shown in FIG. 6. If the display contents are a combination of an image and text, the CPU automatically selects the display mode shown in FIG. 7. Since this eliminates the need for the user to perform a special operation to select the display mode, the operability of the display device 100 improves. It is to be noted that the display device may assume a structure that allows the user to switch the display mode through user operation, instead.

In addition, while the display mode shown in FIG. 6 is optimal, for display contents of text or simple icons as described above under normal circumstances, a different display mode may be selected if the display device 100 is operated in a dark environment. Namely, the CPU 31 may select the display mode in FIG. 6 as long as the detection signal input from the light sensor 35 indicates a level equal to or higher than a predetermined brightness level, whereas it may select the display mode shown in FIG. 5 if the detection signal indicates a level lower than the predetermined brightness level. In the display mode shown in FIG. 5, the backlight (the LED 141 in the example explained above) for illuminating the first display module 10 is turned on and thus, the user is able to view the display contents even in a dark environment.

The optimal display mode may be selected based upon time point information provided from the clock 36 instead of based upon the brightness detection by the light sensor 35. In such a case, the CPU 31 selects the display mode in FIG. 6 during a predetermined block of time (daylight hours) and selects the display mode in FIG. 54 during the rest of the time.

As an alternative, in conjunction with a battery check function of the known art, the CPU may select the display mode in FIG. 5 if the remaining power at the battery BT is equal to or greater than a predetermined value and may select the display mode in FIG. 6 once the level of the remaining power at the battery BT becomes less than the predetermined value. By selecting the display mode based upon the battery power available at the battery BT as described above, the service life of the battery BT can be prolonged.

As a further alternative, the display device may adopt a power saving structure in which the display is automatically switched over to the second display module 20 once static display contents have been displayed via the first display module 10 for a predetermined length of time.

While the first display module 10, constituting part of the display device 100 is an active drive-type display module and thus achieves a higher drawing speed compared to a passive drive-type display module, it needs to be continuously driven (requires continuous power supply) in order to hold the display contents on display. The second display module 20, on the other hand, is a passive drive-type display module with a lower drawing speed compared to the active drive-type first display module. However, this passive drive-type second display module 20 is capable of holding the display contents on display even if the drive (power supply) is stopped.

The present invention is characterized in that a character display can be brought up at the display device 100 by effectively using the high-speed drawing characteristics achieved with the first display module 10 and the display holding characteristics achieved with the second display module 20.

Figure 9:
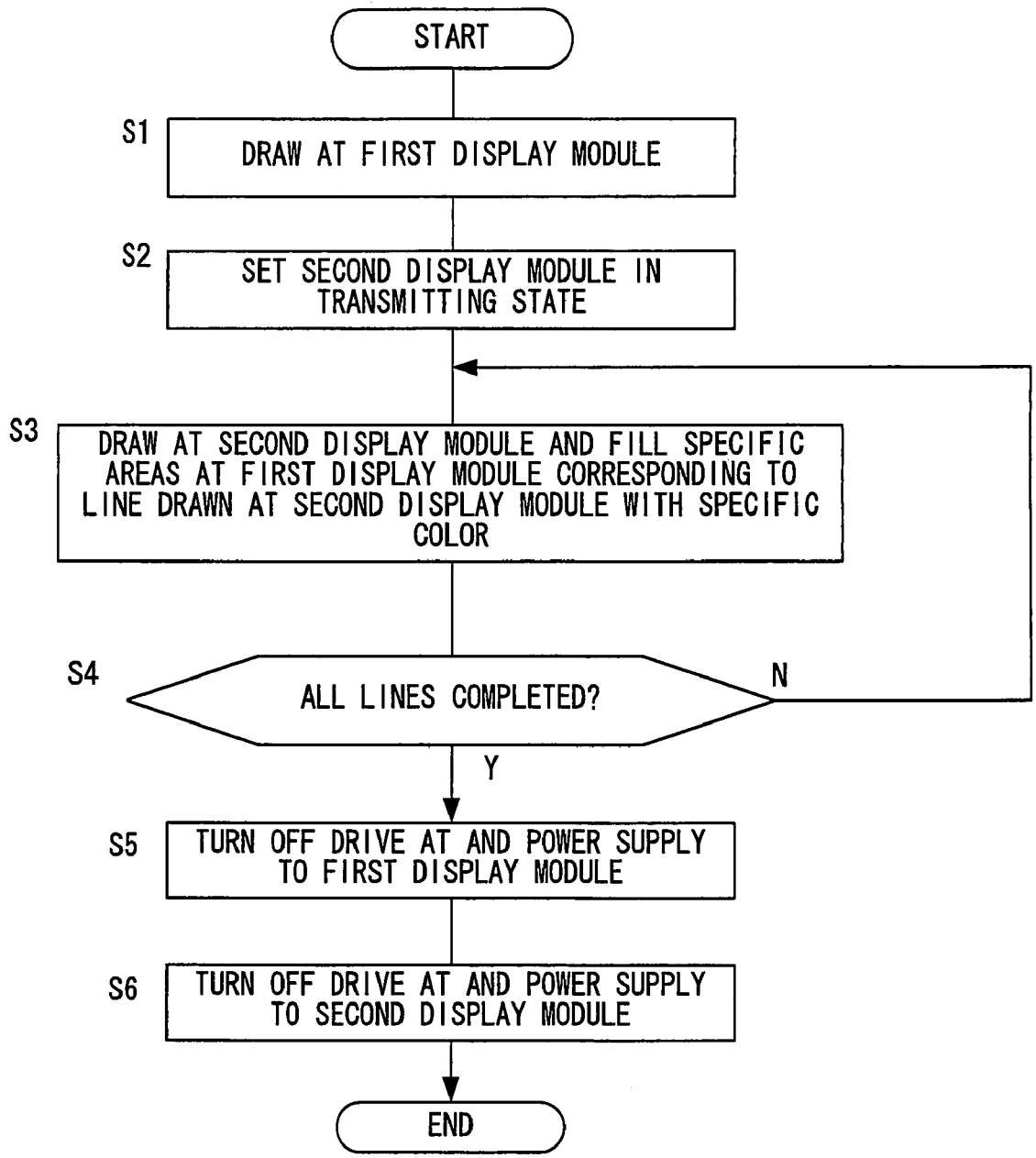
FIG. 9 A flowchart of the procedure of image drawing processing executed by the CPU FIG. 10 The drawing operation at the first display module FIG. 11 The drawing operation at the second display module FIG. 12 The drawing operation at the first display module FIG. 13 A PDA equipped with a display device FIG. 14 A flow chart of the procedure of the drawing processing executed by the CPU FIG. 15 A top view of a digital camera equipped with the display device FIG. 16 A rear view of the digital camera FIG. 17 A front view of the digital camera FIG. 18 A control block diagram of the display device FIG. 19 An example of a display indicating the date and time, which may be provided in the power OFF state FIG. 20 Another example of a display indicating the photographing history that may be provided in the power OFF state FIG. 21 Another example of a display may be provided in the power OFF state indicating the photographing conditions and the like FIG. 22 Another example of a display that may be provided in the power OFF state indicating the menu items FIG. 23 Another example of a display that may be provided in the power OFF state showing a single image FIG. 24 Another example of a display that may be provided in the power OFF state showing a plurality of thumbnail images FIG. 25 Another example of a display that may be provided in the power OFF state simultaneously providing a plurality of types of displays FIG. 26 A front view, a side elevation and a rear view of a portable telephone equipped with a display device FIG. 27 A block diagram of the control system in the portable telephone FIG. 28 A variation of the display device FIG. 29 Another variation of the display device FIG. 30 Yet another variation of the display device

FIG. 9 presents a flowchart of the drawing processing procedure executed by the CPU 31 when, for instance, bringing up a character display. In step S1 in FIG. 9, the CPU 31 issues a drawing instruction for the first display module 10 and then the operation proceeds to step S2. More specifically, the CPU 31 transmits text data, a liquid crystal drive command for displaying text (e.g., black characters) and an LED ON command to the display control circuit 32. As a result, a text screen such as that shown in FIG. 10(a) is drawn at the first display module 10.

In step S2, the CPU 31 issues a drawing instruction for the second display module 20 before the operation proceeds to step S3. More specifically, the CPU 31 transmits a liquid crystal drive command for setting all the pixels in the transmitting state to the display control circuit 33. As a result, the second display module 20 is set in a fully transparent state as shown in FIG. 11(a). The user views the text screen displayed at the first display module 10 through the second display module 20 in the transmitting state. It is to be noted that the order in which the processing in step S1 and the processing in step S2 are executed may be reversed.

In step S3, the CPU 31 executes a drawing operation for the second display module 20 (by setting the areas at the second display module 20 corresponding to the characters as transmitting areas and setting the other areas as reflecting areas, or by setting the areas at the second display module 20 corresponding to the characters as reflecting areas and setting the other areas as transmitting areas) and issues an instruction for setting areas (pixels) on the first display module 10 corresponding to the line drawn at the second display module 20 in a specific color (e.g., black) before the operation proceeds to step S4. More specifically, the CPU 31 transmits text data and a liquid crystal drive command for text display to the display control circuit 33. The text data transmitted to the display control circuit 33 are the same as the data having been transmitted to the first display module 10. As a result, text is drawn, one line at a time, at the second display module 20, as shown in FIG. 11(b). Next, the CPU 31 transmits data for blackening and a liquid crystal drive command to the display control circuit 32. In response, black color is drawn, one line at a time, at the first display module 10, as shown in FIG. 10(b), synchronously with the speed at which the drawing processing is executed at the second display module 20.

In step S4, the CPU 31 makes a decision as to whether or not the processing for all the lines has been completed. The CPU 31 makes an affirmative decision in step S4 if the drawing operation for all the lines at the second display module 20 has been completed to proceed to step S5, whereas the operation returns to step S3 if the drawing operation for all the lines has not been completed yet to continue the processing by repeating the decision-making described above.

In step S5, the CPU 31 issues instructions for stopping the liquid crystal drive at the first display module 10 and turning off the power supply to the first display module 10 and an instruction for the backlight control unit 32b to turn off the backlight, and then the operation proceeds to step S6. As a result, the power supply to the first display module 10 is turned off, with all the lines at the first display module 10 drawn in black, as shown in FIG. 10(c). In step S6, the CPU 31 issues instructions for stopping the liquid crystal drive at the second display module 20 and turning off the power supply to the second display module 20, and thus the processing in FIG. 9 ends. In response, the power supply to, the second display module 20 is turned off with a text screen having contents identical to those in FIG. 10(a) drawn at the second display module 20, as shown in FIG. 11(c). The user is able to view a text screen similar to that brought up on display when the processing in step S2 ended.

The following advantages are achieved in the embodiment described above.

(1) The display device 100 is constituted by layering a passive drive-type second display module 20 on top of an active drive-type first display module 10 and a drawing operation is executed at a specific display module in correspondence to the display contents to be brought up on display. Thus, a colorful and high-contrast display is provided without resulting in any significant increase in the power consumption. In addition, since the first display module 10 can be used as the absorptive layer needed in conjunction with the second display module 20, the need for a special absorptive layer is eliminated to achieve a reduction in the required number of parts. In addition, since the two types of display modules are layered one on top of the other, they can be installed without taking up much more space than that required for the installation of a single display module.

(2) When updating a character display, the first display module 10 is engaged in drawing at the display start with the entire surface of the second display module set in the transmitting state (steps S1 and S2). Thus, the drawing operation (updating of the display contents) can be executed faster compared to the drawing operation executed by engaging the second display module 20.

(3) When updating a character display, display contents identical to those having been drawn via the first display module 10 are drawn at the second display module 20 after the drawing operation at the first display module 10 is completed and the areas (pixels) at the first display module 10, corresponding to the lines drawn at the second display module 20, are set in a black display state (step S3). Thus, contents identical to those having been drawn at the first display module 10 can be gradually drawn at the second display module 20 while holding the text screen on display having been brought up for viewing at the end of the processing in step S2.

(4) When updating a character display, the liquid crystal drive at and the power supply to the first display module 10 are turned off (step S5) with all the lines at the first display module 10 drawn in black and the liquid crystal drive at and the power supply to the second display module 20 are turned off (step S6), following the completion of the drawing operation for all the lines at the second display module 20. As a result, the text screen having been brought up for viewing at the end of step S2 can be held on display and, at the same time, a significant reduction in power consumption is achieved.

(5) To summarize, through an optimal combination of the high-speed drawing characteristics achieved with the first display module 10 and the display holding characteristics achieved with the second display module 20, it is possible to minimize the power consumption and, at the same time, draw the display screen quickly.

In the explanation provided above, the display control for the first display module 10 is stopped by stopping the liquid crystal drive at the first display module 10 and turning off the power supply to the first display module 10 in step S5. Instead, the power supply to the first display module 10 may be sustained as long as an instruction for turning off at least the white LED 141 is issued. Even by turning off the white LED 141 alone, a reduction in power consumption is achieved.

While a text screen is cited as an example of a character display, the present invention may also be adopted in a display of a still image. It is to be noted that while an example in which binary characters are displayed via the second display module 20 in reference to the embodiment, a multi-value image can be displayed by adjusting the drive voltage or by adopting a dithering technology of the known art as well.

In addition, the present invention may be adopted when displaying a screen containing both text information and a still image.

(Variation)

Figure 14:
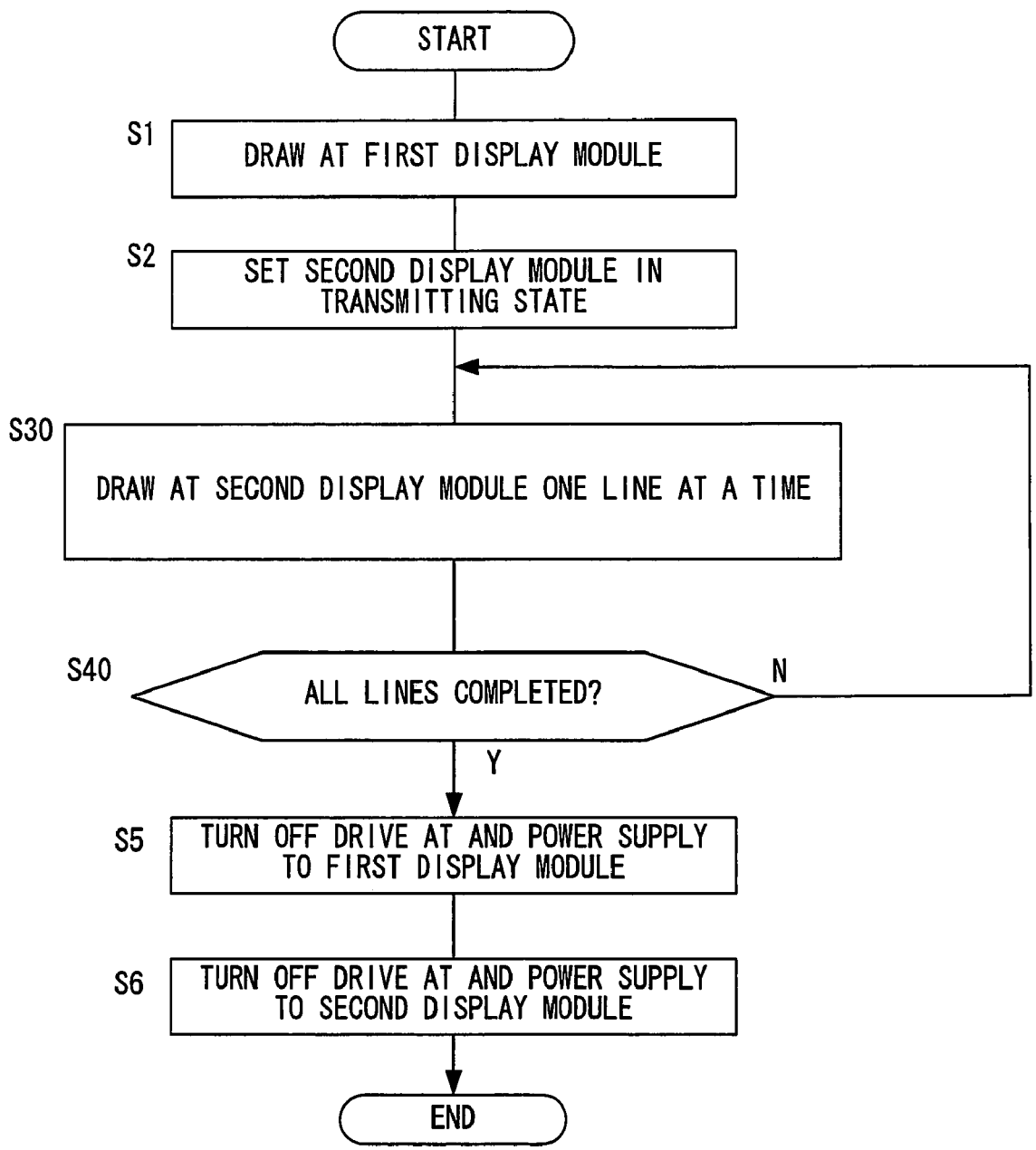

While the drawing operation is executed at the first display module 10 so as to draw the lines, one line at the time in a specific color, in step S3 in the explanation provided above, all the lines may be drawn at once at the first display module 10 after finishing the drawing operation for all the lines at the second display module 20, instead. FIG. 14 presents a flowchart of the operation executed by the CPU 31 in this variation. Since the operations executed in steps S1, S2, S5 and S6 are identical to those executed in the corresponding steps in FIG. 9, their explanation is omitted. FIG. 12 presents an example of display contents that may be drawn at the first display module 10 in the variation. Since the contents shown in FIGS. 12(*a*) and 12(*c*) are identical to those shown in FIGS. 10(*a*) and 10(*c*) respectively, their explanation is omitted.

In the variation, the CPU 31 holds the entire, full line text screen having been drawn in step S1 at the first display module 10 as shown in FIG. 12(*b*) while the text is drawn one line at a time at the second display module 20, as shown in FIG. 11(*b*) in step S30. The user is able to view the text screen in much the same way as the way the text screen was viewed at the end of step S2.

In step S40 in the variation, the CPU 31 makes a decision as to whether or not the drawing operation for all the lines has been completed at the second display module 20. The CPU 31 makes an affirmative decision in step S40 if the drawing operation for all the lines has been completed at the second display module 20 to proceed to step S5. As a result, all the lines at the first display module 10 are set in the black display state (the power supply off/drive OFF state) at once. It is to be noted that the display at the first display module 10 may assume a specific color (the power supply on/drive ON state) at this time, instead. If, on the other hand, the drawing operation for all the lines has not been completed at the second display module 20, the CPU 31 repeatedly executes the decision-making processing.

While the first display module 10 is constituted with a TFT liquid crystal module in the example explained above, the first display module may be constituted with an organic EL module instead. Since the element itself emits light at an organic EL module, the first display module constituted with an organic EL module will not require a backlight member. As an alternative, an inorganic EL element may be used to constitute the first display module 10. As a further alternative, a liquid crystal module adopting a system other than the TFT system, such as an STN liquid crystal module, may be utilized.

Furthermore, the second display module 20 may be constituted with a PN (polymer network) liquid crystal module instead of a cholesteric liquid crystal module. While a PN liquid crystal module, which does not have the memory holding property, must be driven and supplied with power constantly in order to hold display contents, it does not require a backlight and the element itself does not emit light, allowing it to hold the display contents on display with a lower level of power consumption. Moreover, while the color of reflected light at a cholesteric liquid crystal takes on a yellowish or reddish tinge, the light reflected at a PN liquid crystal is white, which makes it possible to display sharply defined black letters against a white base or sharply defined white letters against a black base.

Second Embodiment

Figure 15:
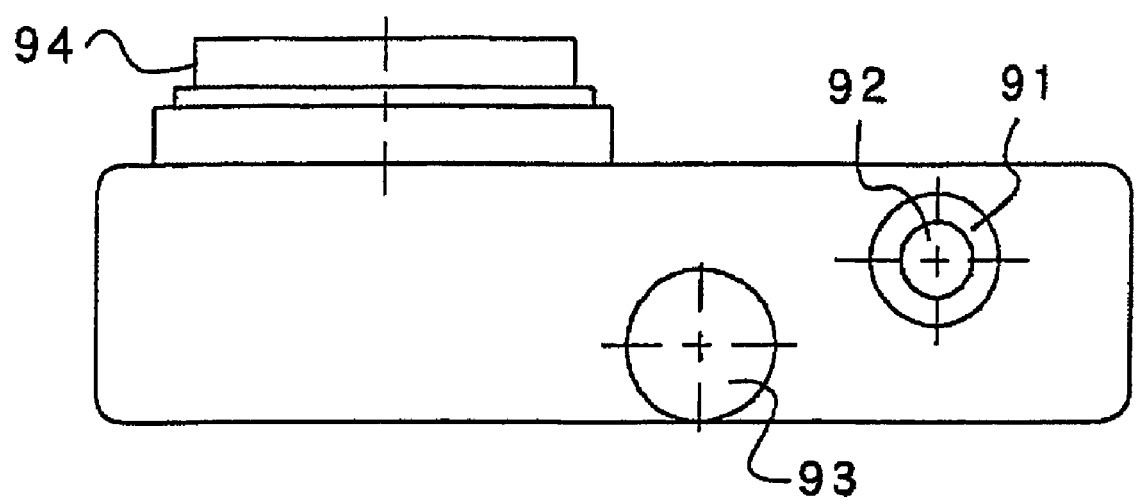
Figure 16:
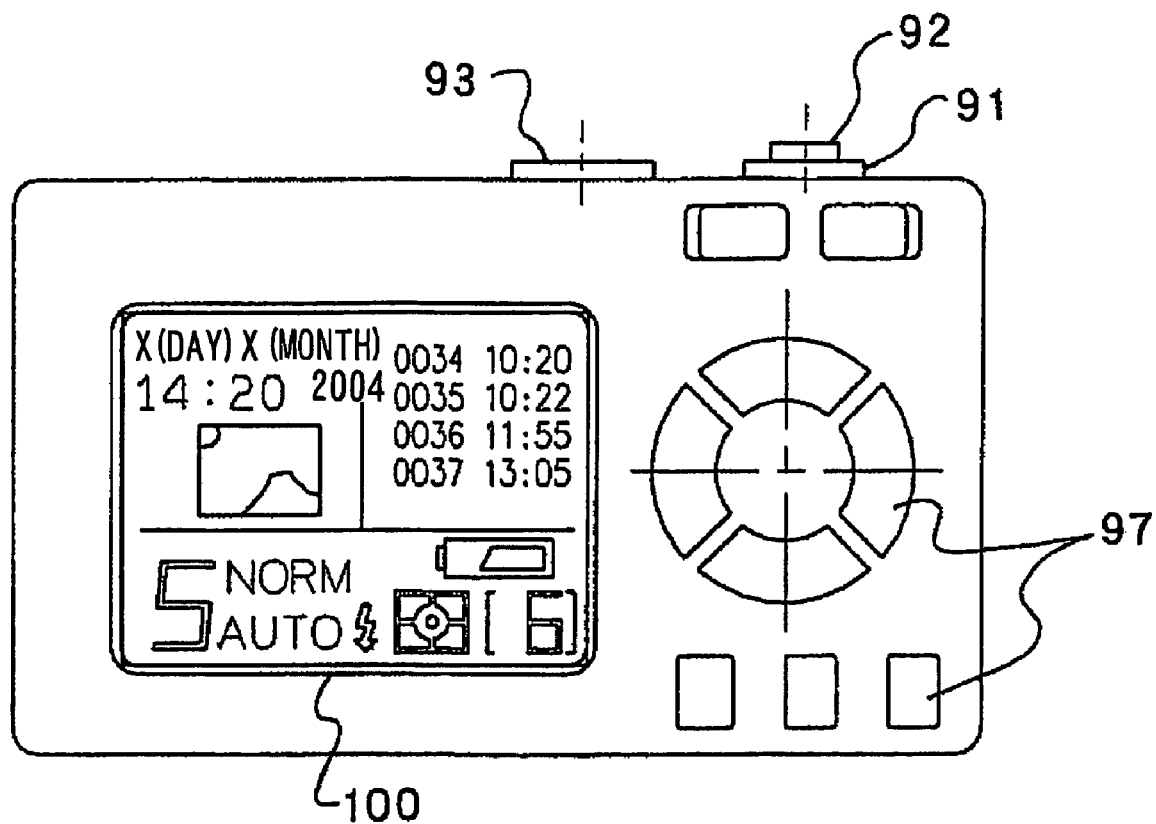
Figure 17:
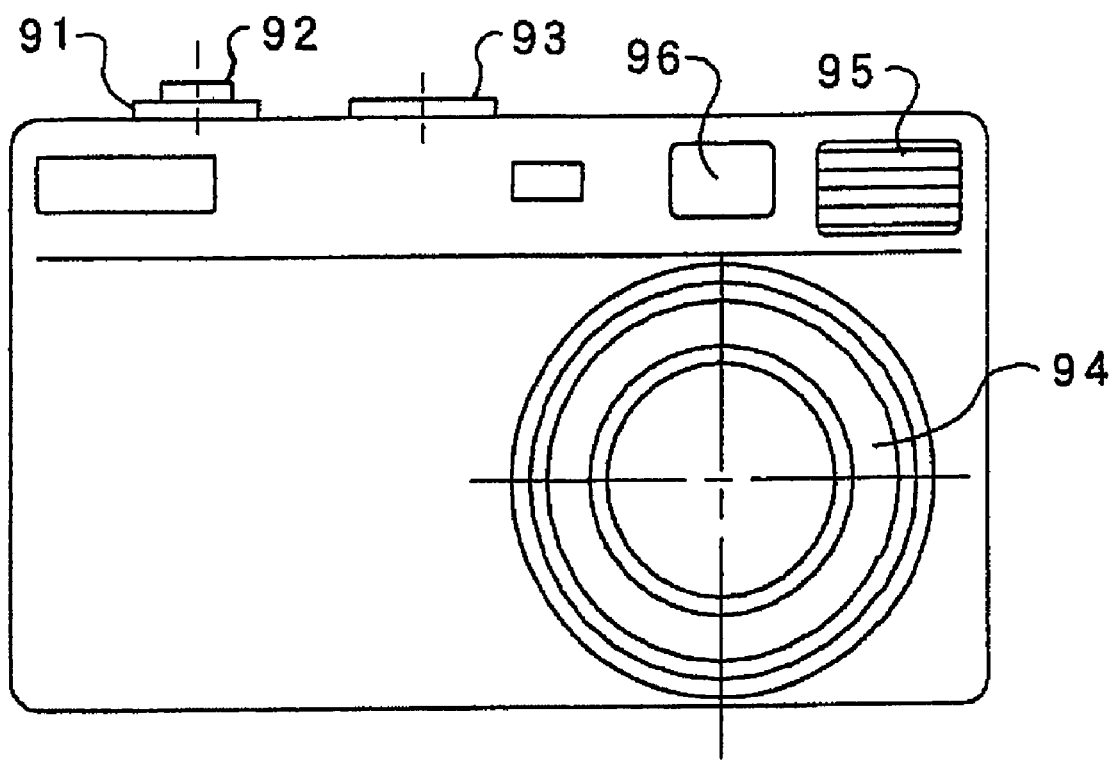

In reference to FIGS. 15 through 25, the second embodiment achieved by adopting the present invention in a digital camera is explained. FIGS. 15 through 17 respectively present a top view, a rear view and a front view of a digital camera achieved in the embodiment. At the top surface of the camera, a power switch (main switch) 91, a shutter release button 92 through which an imaging start instruction is issued, an operation dial 93 and the like are disposed. At the camera front surface, a photographic lens 94, a light emission window 95 of an electronic flash unit, an objective window 96 of a view finder and the like are disposed. At the camera rear surface, a plurality of operation members 97 and a display device 100 are disposed. It is to be noted that while the figures show a compact digital camera, the present invention may instead be adopted in a single lens reflex-type digital camera.

It is to be noted that since the display device 100 assumes a structure similar to that adopted in the display device in the first embodiment, the same reference numerals are assigned to its components so as to preclude the necessity for a repeated explanation thereof.

Figure 18:
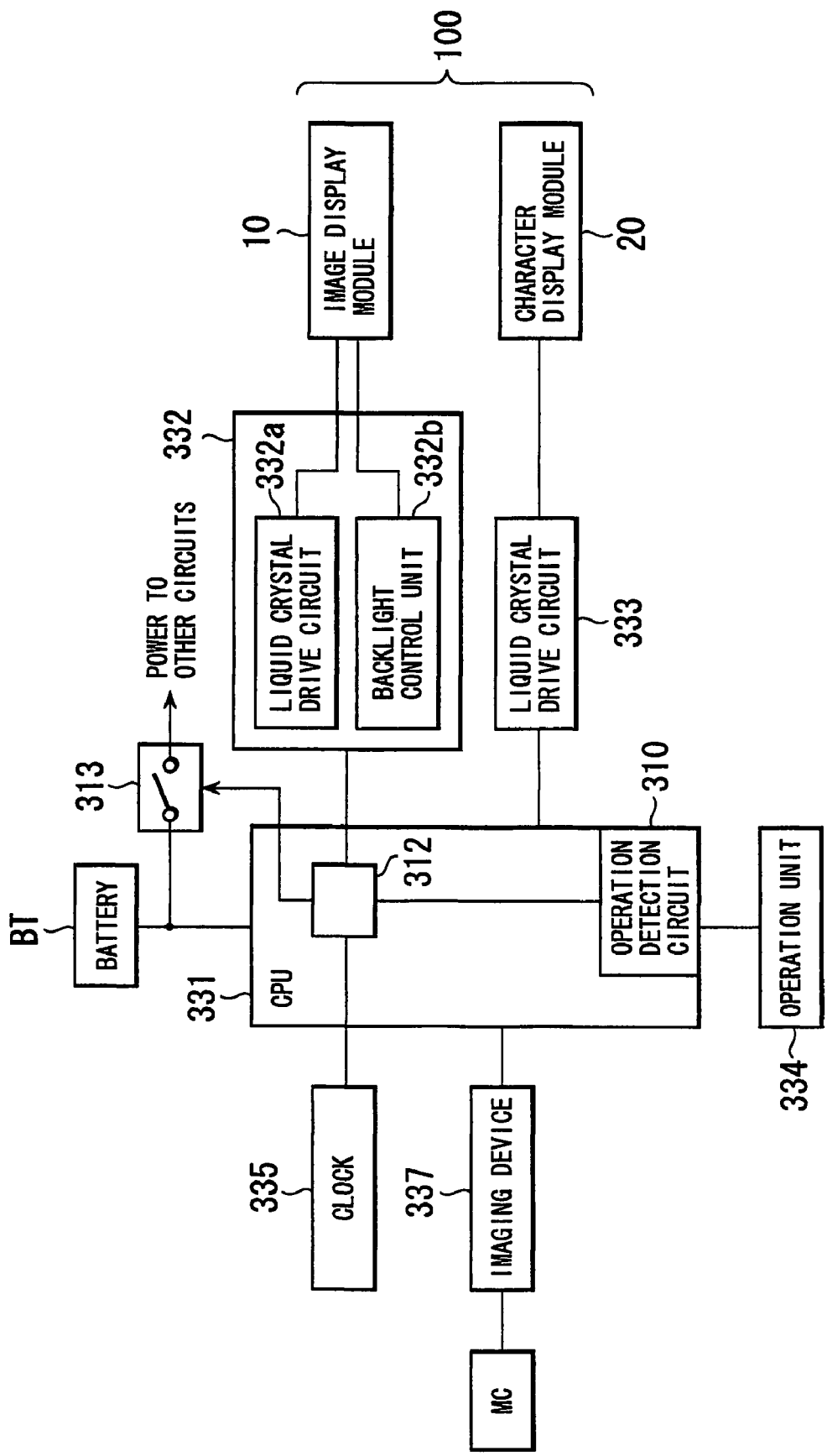

FIG. 18 is a control block diagram related to the display control executed in the digital camera in the second embodiment, showing only the primary structural components of the digital camera. An imaging device 337, constituted with an imaging element, an A/D conversion circuit, an image signal processing circuit, a recording circuit and the like, generates image data based upon a photoelectric conversion output from the imaging element and records the image data thus generated into a memory card MC. A drive circuit 332 controls the drive of the image display module (first display module) 10 having been described earlier, and comprises a liquid crystal drive circuit 332a which drives the liquid crystal via the transparent electrode and a backlight control unit 332b which controls the backlight unit 14. A liquid crystal drive circuit 333 controls the drive of the character display module (second display module) 20. In addition, these drive circuits, an operation unit 334 which includes the power switch 91, and the shutter release switch and a clock 335 are also connected to a CPU 331 constituting a control means (circuit) for controlling the overall device. Power is supplied to the CPU 331 and the various circuits from a battery BT.

Examples of displays that may be brought up at the display device 100 mounted at the digital camera are now explained.

The digital camera enters a power ON state as the power switch 91 is turned on and enters the power OFF state as the power switch 91 is turned off. In the power OFF state, the power supply to most circuits is turned off and photographing operation is disabled, but power is still supplied to some components such as a time counting circuit engaged to realize a clock function via the clock 335 and the CPU 331. In addition, in order to minimize power consumption, the camera has an auto power off function, which enables it to automatically enter the power OFF state when a predetermined length of time elapses with no operation executed in the power ON state. If any operation (e.g., a halfway press operation) is performed in the auto power OFF state, the power ON state is recovered.

Now, the auto power off function is explained in further detail. Power is supplied at all times from the battery BT to the CPU 331, the clock 335, the operation unit 334, an operation detection circuit 310 and a switch control circuit 312, regardless of the operation status at the power switch 91. This particular condition is equivalent to the power OFF state that the digital camera will enter in response to the power OFF operation at the power switch 91. In the power ON state, on the other hand, power is supplied via a switch 313 to the other circuits in addition to the CPU 331, the clock 335, the operation unit 334, the operation detection circuit 310 and the switch control circuit 312. In the power ON state, the clock 335 measures the length of time over which the operation unit 334 remains unoperated, and once the length of time thus measured becomes equal to or greater than a predetermined length of time, the switch 313 is set in an open state via the switch control circuit 312 of the CPU 331, thereby cutting off the power supply to the other circuits. It is to be noted that as an alternative, operations of the other circuits may be set in a standby state (sleep state) via a control input terminal through which the operating states of the other circuits are controlled, and in this case, the power supply to the other circuits may be sustained. The power consumption can be reduced through such control as well.

As the operation detection circuit 310 detects in the auto power OFF state that an operating member at the operation unit 334 has been operated, the switch 313 is set in a closed state via the switch control circuit 312, thereby starting power supply to the other circuits. As an alternative, the operations at the other circuits may be switched from the standby state (sleep state) to an active state in response to power input to the control input terminal, instead of starting the power supply.

(Power ON State)

In response to a power ON operation, the camera starts an imaging operation and sequentially updates the display at the display device 100 with images captured in sequence (through image display). This means that the display device 100 can be utilized as a view finder. In response to a shutter release operation, an imaging operation is executed in order to capture an image to be recorded into the memory card MC and the captured image is displayed at the display device 100 over a predetermined length of time (freeze image display). In addition, in a reproduction mode selected by performing a specific setting selection operation, an image recorded in the memory card MC can be read out and displayed at the display device 100 (reproduced image display). A single image may be brought up in the reproduced image display, or a plurality of images may be brought up as thumbnail images in a single screen in the reproduced image display. The through image display, the freeze image display and the reproduced image display are all brought up by adopting the display mode illustrated in FIG. 5 in reference to which the first embodiment has been explained.

In addition, an image and image information (the photographing date, the photographic data and the like) can be brought upon display simultaneously by adopting the display mode illustrated in FIG. 7 in reference to which the first embodiment has been explained. Furthermore, a menu display for custom setting and the like, instead of an image, can be brought up on display so as to allow the user to select various settings by viewing the display. Since better visibility can be assured for the menu display by providing it in color, the menu display is brought up in the display mode shown in FIG. 5 under normal circumstances. However, the menu display may be provided by adopting the mode shown in FIG. 6 or FIG. 7 when, for instance, the remaining battery power available at the battery is low. For instance, a high level of convenience is assured by using a battery check function so that as the remaining battery power becomes lower than a predetermined level, the display mode in FIG. 5 is automatically switched to the display mode shown in FIG. 6 or FIG. 7. Alternatively, the camera may adopt a structure that allows the user to switch the display mode by performing a specific operation.

(Power OFF State)

In order to minimize power consumption, once a camera enters the power OFF state (including the auto power OFF state), the power supply to the display device is cut off and thus no display is provided at the camera in the related art. However, the camera achieved in the embodiment is capable of sustaining the display continuously via the character display module 20, without consuming power except when updating the display. In other words, the display is continuously provided via the character display module 20 even in the power OFF state. Namely, as the power switch 91 is turned off or as the length of time matching the auto power off wait time elapses, the CPU 331 automatically switches to the display mode shown in FIG. 6 to bring up display contents set in advance and then turns off the power. As a result, since information that cannot be read without turning on the power in the related art, can be checked in the power OFF state, the operability of the camera improves.

As the camera in the power OFF state reenters the power ON state, it is automatically switched to the power on display mode explained earlier.

Next, examples of displays that may be brought up in the power OFF state are explained in reference to FIGS. 19 through 25.

FIG. 19 presents an example of a display indicating the current date and time brought up via the character display module 20 in the power OFF state. Since the clock 335 remains operating even in the power OFF state, the time point display can be provided based upon the information originating from the clock 335. In the case of an hour/minute display, such as that shown in the figure, power must be supplied to the character display module 20 every minute to update the display once a minute. However, power does not need to be used otherwise and thus the quantity of power consumed by the display can be kept at a minimum. In addition, a text message indicating the power OFF state is displayed at the bottom of the screen in this example. While a date screen or the like on display tends to mislead the user to think that the camera is in the power ON state, this text message indicating the power OFF state reduces the likelihood of such a misconception. A text message such as "Turn on power before taking a picture" may be displayed, instead.

FIG. 20 presents an example of a display indicating the photographing history brought up via the character display module 20 in the power OFF state. In this example, the file names of image files having been generated and recorded through photographing operations, the corresponding photographing dates and times are displayed in a table format as history information. Information corresponding to the most recent image files among a plurality of image files is displayed. The information four more recent files may be presented at higher positions in this display. Since the history information does not change until the next photographing operation, substantially no power is needed to provide this display provided in the power OFF state. It is to be noted that the icons displayed in the lower right corner of the screen prompt the user to turn on the power (indicate that the camera is currently in the power OFF state).

Figure 21:
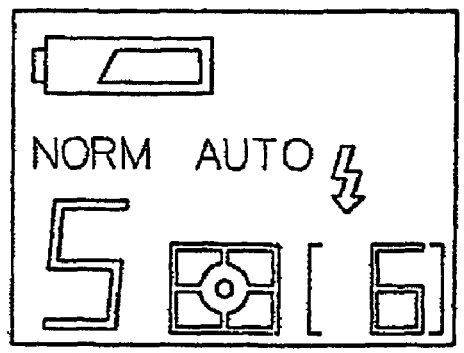

FIG. 21 presents an example of a display indicating the current photographing condition settings and the remaining battery power, brought up via the character display module 20 in the power OFF state. The photographing condition settings, such as the current image quality mode, the current photographing mode, the speed light information, the current photo metering mode and the number of frames of images that can be photographed, are indicated by using characters and icons in this example. In addition to these photographing condition settings, the aperture setting, the shutter speed setting and the like may be indicated as well. Since this information, too, remains unchanged in the power OFF state, substantially no power is required to provide the display in the power OFF state. It is to be noted that since the number of frames of images that can be photographed may change as the memory card is replaced, the corresponding display contents may be updated at the time of memory card replacement.

Figure 22:
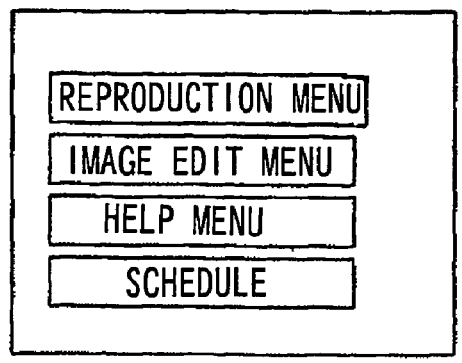

FIG. 22 presents an example of a display indicating various menus, brought up via the character display module 20 in the power OFF state. The menus include a reproduction menu related to image reproduction, an image edit menu related to image editing and a Help menu. A specific menu, selected in advance by the user, may be displayed or a plurality of menu items may be displayed as shown in the figure so as to allow the user to select one item among them. In addition, schedule information, memos or the like, input by the user in advance, may be displayed. Such a display can be provided without using any power except when updating the display contents or scrolling the display.

Figure 23:
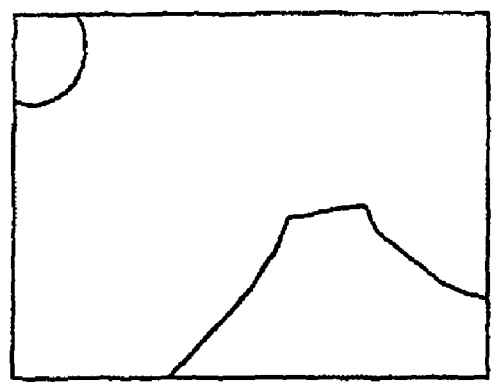
Figure 24:
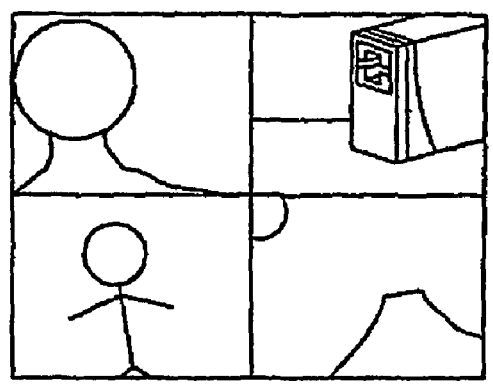

FIGS. 23 and 24 present examples of displays of previously photographed images, brought up on display via the character display module 20 in the power OFF state, with FIG. 23 presenting an example of a single image display and FIG. 24 presenting an example of a thumbnail display showing four images. In either case, a recently photographed image (or recently photographed images) is displayed to allow the user to ascertain the previous photographing contents, photographing location and the like without having to turn on the power and thus, better user convenience is assured. It is to be noted that while the character display module 20, which provides monochromatic display and does not achieve rich tonal expression as explained earlier, is not ideal for image display, the user only needs to be able to check the past photographic subjects and thus, the character display module is sufficient.

Figure 25:
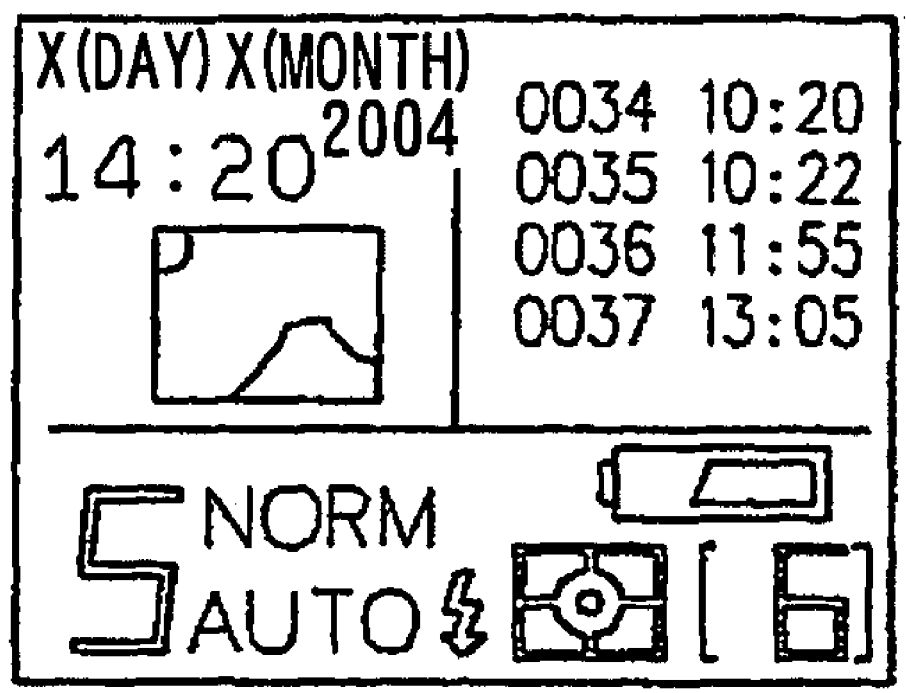

A display containing some of the display contents described above in combination may be provided. For instance, the screen may be split into three separate areas with a recently photographed image and the corresponding photographing date and time displayed in one area, the photographing history displayed in another area and information indicating the camera settings displayed in the third area, as shown in FIG. 25. A display containing display contents in another combination may be provided instead.

In addition, the camera may have an Electronic Book function (Electronic Book viewing mode). As the Electronic Book viewing mode is selected in such a camera in response to an operation at the operation unit 334, the contents of an Electronic Book can be displayed by using a memory card MC. While the camera may be utilized as an Electronic Book either in the power ON state or in the power OFF state, the zoom in/out buttons, for instance, can be used as page up/down buttons by limiting its use in the power OFF state.

When the Electronic Book viewing mode is selected in the power OFF state, the switch control circuit 312 executes control so as to sustain the switch 313 in the open state even if the zoom in or the zoom out button at the operation unit 334 is operated. Under these conditions, too, power is supplied to the character display module 20 only when a zoom in/out button is operated to update the display at the character display module 20. It is to be noted that the display at the character display module 20 may be automatically selected regardless of the state of the power switch 91 whenever the camera is set in the Electronic Book viewing mode and an instruction for Electronic Book contents display is issued. Such a structure, too, reduces the overall power consumption in the device.

It is desirable that the camera have all the display functions shown in FIGS. 19 through 25 and allow the user to select in advance a specific display setting. It is also desirable that information indicating the power OFF state be displayed as shown in FIGS. 19 and 20, as long as the information can fit into the display space at any display setting. However, the minimum display requirements for the camera are that it must have at least one of the display functions.

It is to be noted that while an explanation is given above in reference to the embodiment on an example in which power to most of the circuits, excluding the clock circuit, the CPU 331 and the like, is cut off in the power OFF state, the display can be continuously held in the power OFF state by utilizing a memory-type display element constituted with a cholesteric liquid crystal or the like even if power to all the circuits in the device is cut off.

Third Embodiment

Next, the third embodiment achieved by adopting the present invention in a portable telephone is explained. The portable telephone in FIG. 26 includes a display device 100B disposed at its rear surface in addition to a main display device 100A, and both display devices adopt a two-layer structure achieved in the first embodiment having been explained in reference to FIGS. 1 through 3. Namely, the display devices 100A and 100B each comprise an image display module (first display module) 10 and a character display module (second display module) 20, as does the display device in the first embodiment. It is to be noted that only one of the display devices may adopt the two-layer structure.

Figure 27:
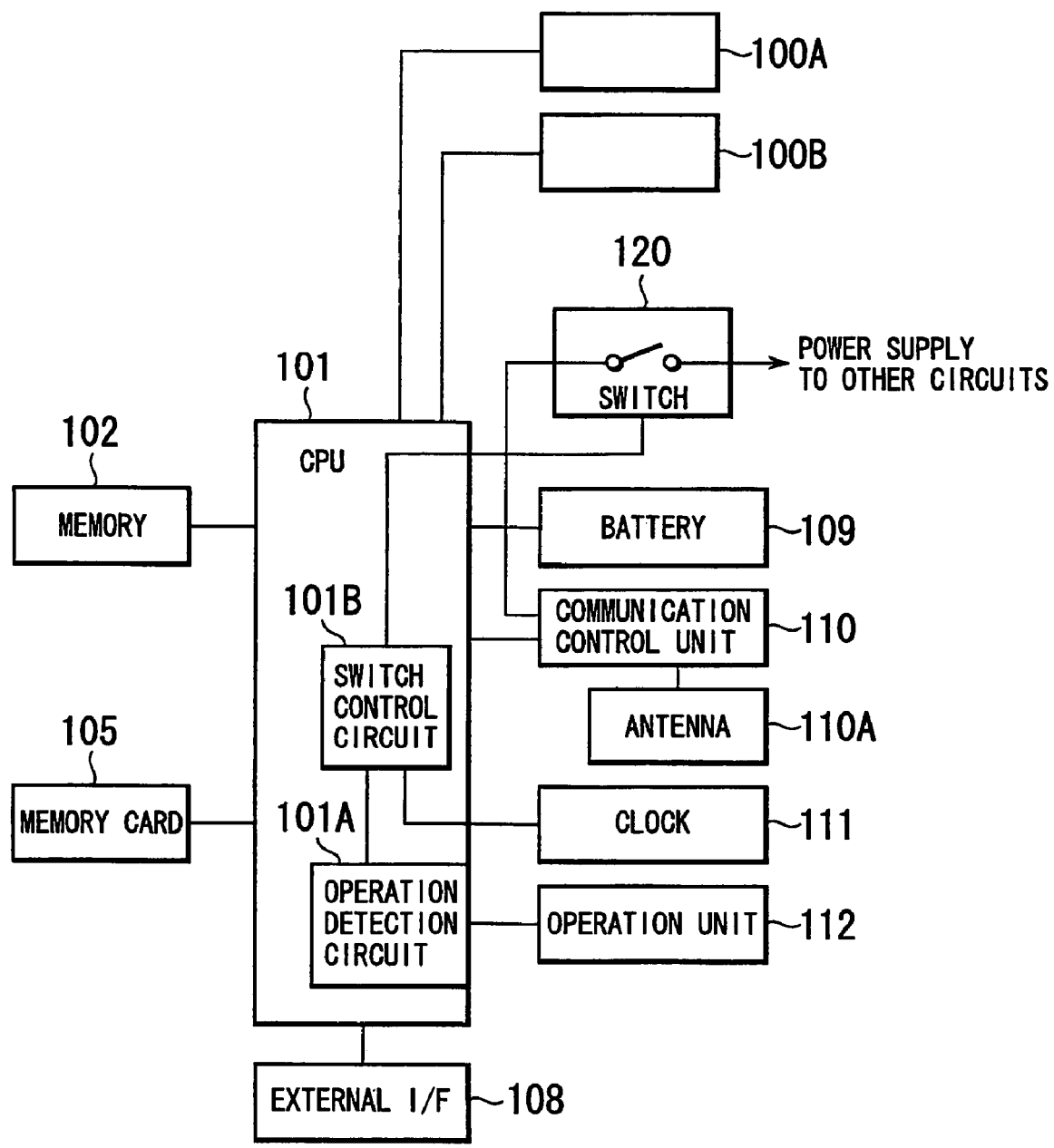

FIG. 27 is a block diagram of the control system in the portable telephone. The display devices 100A and 100B, a memory 102, an external interface (I/F) 108, a battery 109, a communication control unit 110, a clock 111 and an operation unit 112 are connected to a CPU 101 constituting a control means (circuit) for controlling the overall operations of the portable telephone.

The operation member 112, which includes dialing buttons of the telephone and the like, outputs an operation signal corresponding to a depressed button to the CPU 101. The communication control unit 110, which includes an antenna 110A and a wireless transmission/reception circuit, enables voice communication with another telephone via a base station (not shown) in response to a command from the CPU 101. In addition to telephone voice calls, image data of images photographed by using the camera function and the like can be transmitted/received via the communication control unit 110. Reference numeral 105 indicates a detachable memory card, and the CPU 101 is capable of recording image data and the like into the memory card 105 and reading out image data and the like from the memory card 105. The external interface 108 exchanges data with an external device via a cable (not shown) or a cradle (not shown) in response to a command from the CPU 101.

Power is supplied constantly from the battery 109 to the CPU 101, the clock 111, the operation unit 112, an operation detection circuit 101A and a switch control circuit 101B. When the portable telephone is not in a standby state, power is supplied to the other circuits as well via a switch 120 in addition to the CPU 101, the clock 111, the operation unit 112, the operation detection circuit 101A and the switch control circuit 101B. In this condition, the clock 111 measures the length of time over which the operation unit 112 remains unoperated and as the measured length of time becomes equal to or greater than a predetermined specific length of time, the switch control circuit 101B at the CPU 101 sets the switch 120 in the open state, thereby cutting off power to the other circuits.

In the regular operating state, various displays are provided in the display mode shown in FIG. 5 in reference to which the first embodiment has been explained via the image display module 10. The display contents include a basic telephone operation screen and a settings screen. In addition, if the telephone has an online service mode capability, Web contents (homepage, still and dynamic images) and an e-mail operation screen may be displayed. In a portable telephone with a photographing function, still images and dynamic images photographed with the portable telephone and still images, dynamic images and character data transmitted from a communication partner, i.e., another portable telephone, can be displayed. At the image display module 10, full-color displays can be provided and the screen can be switched or scrolled at high speed.

As explained earlier, when no operation is performed at the portable telephone over the predetermined length of time, the portable telephone automatically enters the standby state under the control executed by the CPU 101. As the portable telephone shifts into the standby state, the CPU 101 functioning as the display control means switches to the display mode shown in FIG. 6 to bring up a display of preselected display contents at the character display module 20. As explained earlier, the power consumption is minimized in the display mode in FIG. 6. If any operation is performed in the standby state, the portable telephone automatically reverts to the display mode shown in FIG. 5.

Figure 26:
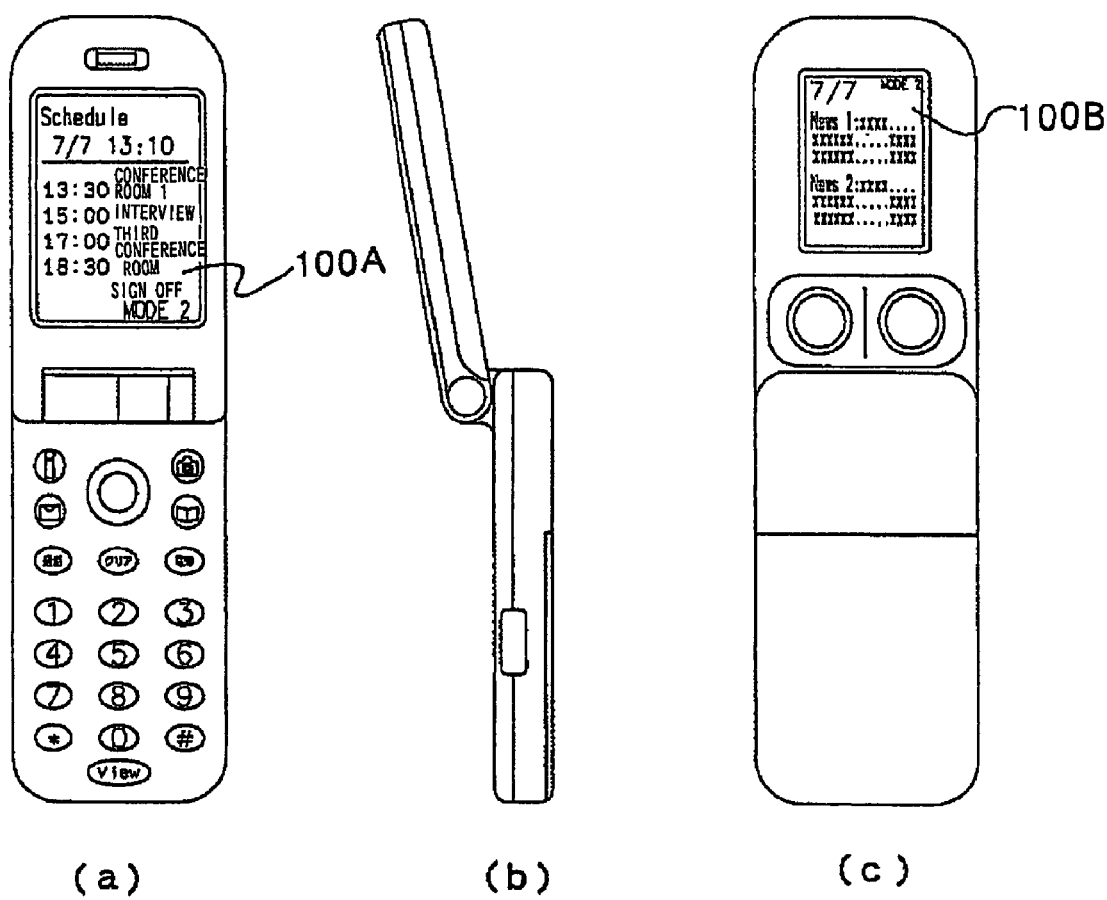

FIG. 26(*a*) presents an example of display contents that may be brought up in the standby state. They include a schedule input in advance in addition to a display of the date and time. While the schedule display must be updated (rolled forward) as time passes, such an update may be executed, for instance, once an hour or every 30 minutes. In the standby state, power is supplied to the clock 111 at all times to engage it in time count operation but power is supplied to the character display module 20 only when the display needs to be updated, e.g., once every 30 minutes or every hour.

FIG. 26(*c*) presents an example of a display that may be brought up at the display device 100B located at the rear surface in the standby state, providing the date and current news. This display can be provided by accessing a news site and downloading the latest information in the online service mode. By selecting a setting that automatically downloads the latest information and automatically updates the display accordingly every few hours, the user is able to check the latest news at all times in the standby state. The update interval may be set freely by the user.

In the standby state, power is supplied to the communication control unit 110 every few hours in order to download online service information and in synchronization with the download, power is supplied to update the display at the character display module 20 of the display device 100B with the downloaded information. In addition, the portable telephone may adopt a structure that also allows it to sustain the standby state in response to an operation of a specific operating member in the online service mode and, in such a case, the user is able to download the latest information and update the display at the character display module 20 with minimum power whenever he desires by operating the specific operating member. It is to be noted that the display at the character display module 20 may be automatically selected regardless of whether or not the portable telephone is currently in the standby state whenever the online service mode is selected and an online service contents display instruction is issued. Such a structure, too, reduces power consumption at the device.

Since the display at the character display module 20 is provided by using ambient light, the display cannot be viewed with ease and its contents cannot be checked readily in a dark environment. Accordingly, the display at the character display module 20 may be disabled during a time block corresponding to nighttime and, during this period of time, all displays may be provided via the image display module 10 (in the display mode shown in FIG. 5). Since this time block is bound to vary with different users, it is desirable to allow the user to preset this time block. For instance, the user may enter "midnight 0:00~5:00" to indicate a specific time block during which the display at the character display module 20 is to be disabled and all displays are to be provided via the image display module 10. Furthermore, for a time block (e.g., 7:00~17:00) during which the surrounding environment is assumed to be reasonably light, the display at the display module 20 may be selected as the default setting and displays may be provided either via the display module 10 or the display module 20.

The following advantages are achieved in the second embodiment and the third embodiment described above.

(1) Displays in the first display mode, at least can be provided via the image display module 10 in the power ON state, whereas in the power OFF state, the display in the first display mode is disabled and the character display module 20 is enabled to provide displays in the second display mode. Thus, while displays achieving a high level of visibility are provided through light emitting display in the power ON state, displays can be provided by using the ambient light and thus minimizing power consumption in the power OFF state. Through a display brought up in the power OFF state in this manner, information that cannot be read without first turning on the power in the related art can be read even in the power OFF state, and thus, better user convenience is assured.

(2) If a display brought up at the image display module 10 in the first display mode is sustained over a specific length of time with no further operation performed, the display mode is switched to the second display mode to provide a display via the character display module 20. As a result, a display can be provided with minimum power consumption in the auto power OFF state or the standby state to assure better user convenience, as in (1).

(3) If any operation is performed while a display is up at the character display module 20 in the second display mode, the display mode is switched to the first display mode to bring up a display via the image display module 10. In other words, a display with a higher level of visibility, achieved through light emitting display, can be selected as desired by the user.

(4) Either the first display mode, which engages the image display module 10, or the second display mode, which engages the character display module 20, is selected for the display device in correspondence to the operating mode. As a result, the optimal display suited to a specific operating mode can be provided while assuring better energy efficiency.

(5) Since either the first display mode, which engages the image display module 10, or the second display mode, which engages the character display module 20, is selected at the display device in correspondence to the display contents to be displayed, an optimal display best suited for the particular display contents can be provided while assuring better energy efficiency.

(6) During a preselected time block, the display in the second display mode at the character display module 20 is disabled and only the display at the image display module 10 in the first display mode is enabled. During the rest of the time, displays can be brought up either in the first display mode or in the second display mode. Thus, in the time block during which the surrounding environment is bound to be dark and displays brought up at the character display module 20 in the second display mode could not be easily viewed, the image display module 10 is exclusively engaged to provide easily readable displays in the first display mode (light emitting display).

Next, variations of the display device are explained.

Figure 28:
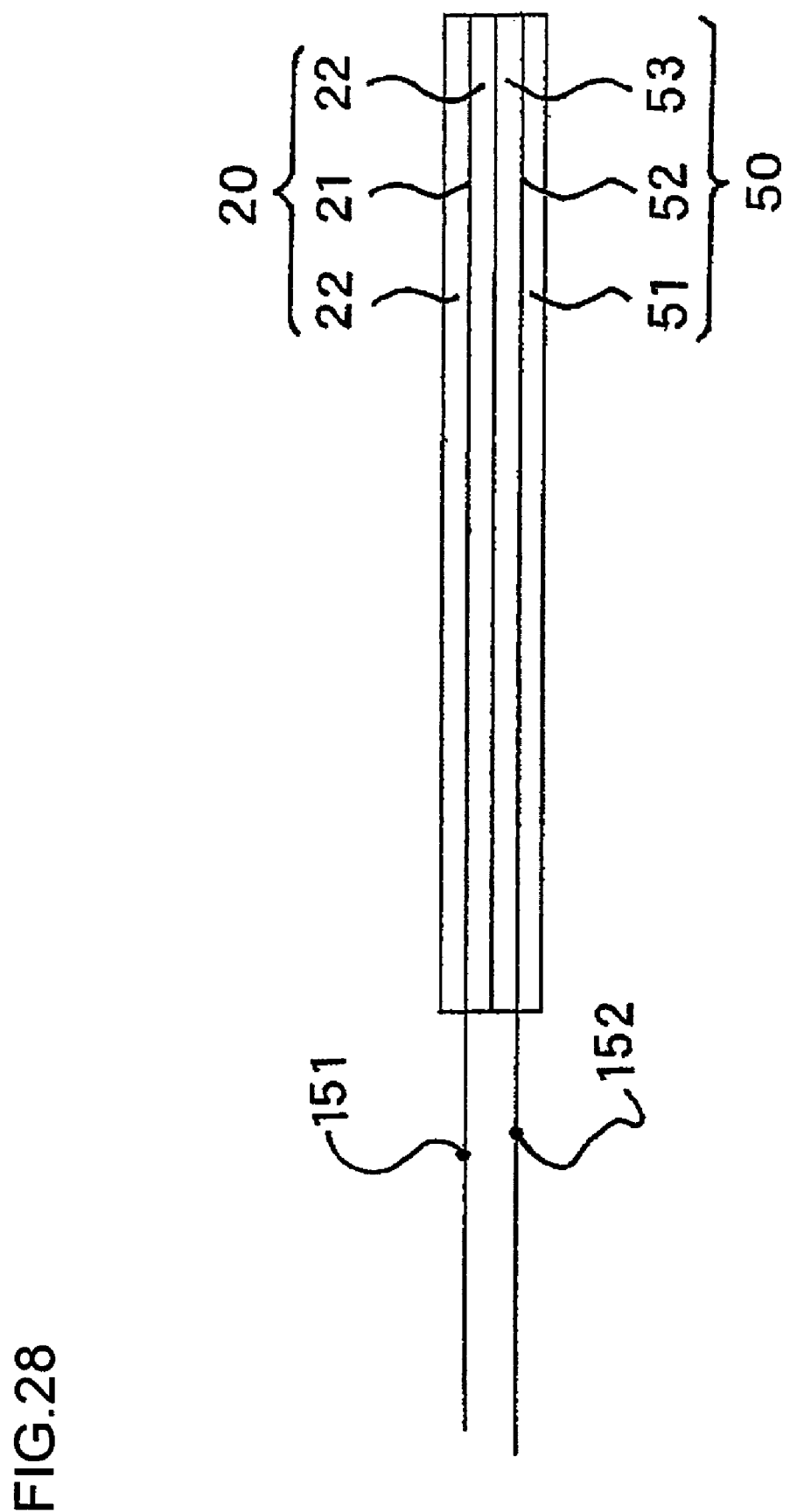

The display device shown in FIG. 28 includes an image display module constituted with an organic EL module 50 instead of the liquid crystal module described earlier. As known in the related art, the organic EL module 50 comprises a drive substrate 51, a light emitting layer made up with a plurality of organic EL elements arrayed on the substrate 51 in a matrix pattern, a glass plate 53 covering the light emitting layer 52, a color filter (not shown) and the like. Display data and the like are transmitted via, for instance, a flexible printed circuit board 152. Since the elements themselves emit light, no backlight is required, which makes it possible to provide an image display module with a lower profile compared to an image display module constituted with a liquid crystal module. In this case, too, the quantity of light output can be controlled in correspondence to each pixel by controlling the quantity of emitted light in correspondence to a specific element, and the organic EL module which includes a color filter is ideal for full-color display of still and dynamic images, as is the liquid crystal module. Furthermore, since pixels set in a non-light emitting state are black areas where light having been transmitted through transmitting areas at the character display module 20 is absorbed, the transmitting areas can be shown as is. Thus, the organic EL module can be utilized in a manner similar to that explained in reference to the previous embodiments. It is to be noted that the image display module may instead be constituted by using inorganic EL elements.

Figure 29:
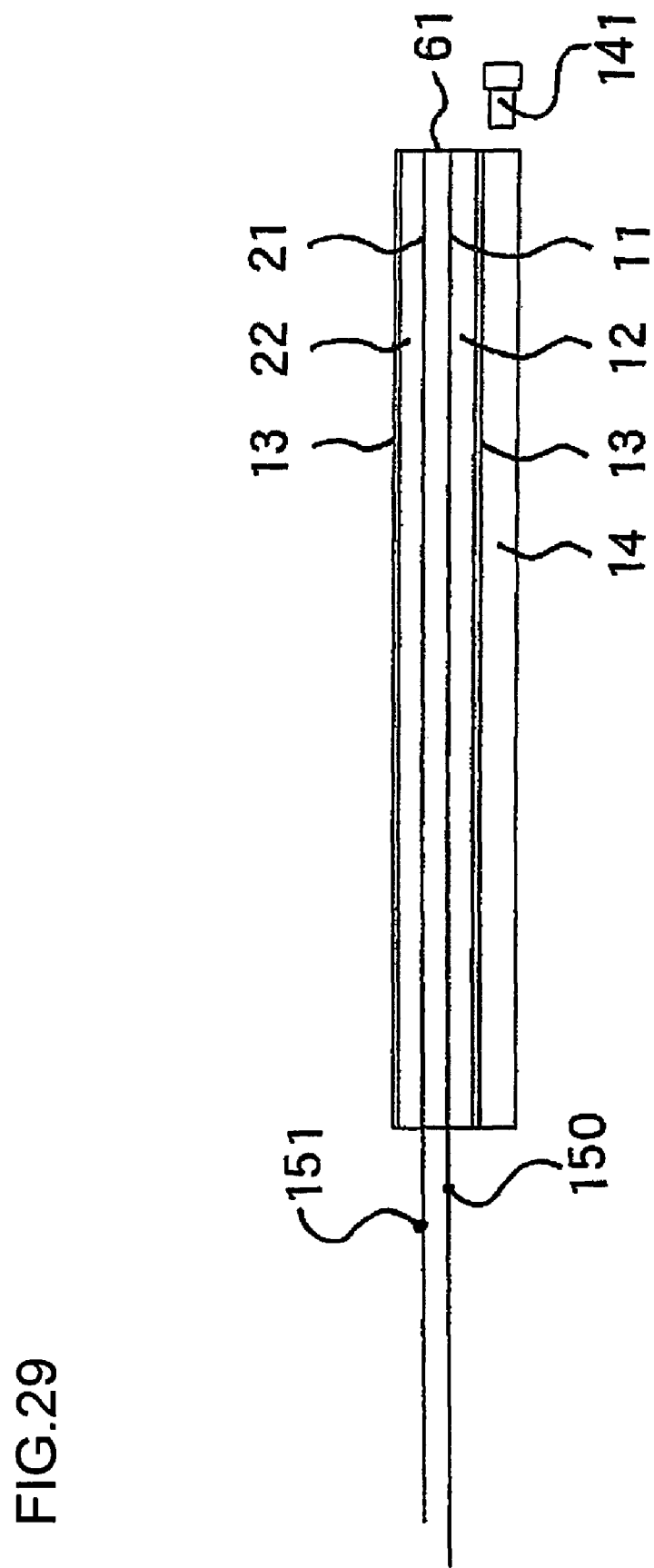

FIG. 29 presents an example in which a single glass substrate is shared by an image display module and a character display module. Namely, the glass substrate and 61 in the figure is used both as an upper glass substrate of the image display module (liquid crystal module) and as a lower glass substrate of the character display module. A transparent electrode portion for the image display module is formed on the lower surface side of the glass substrate 61, whereas a transparent electrode portion for the character display module is formed on the upper surface side of the glass substrate 61. In this structure, a polarizing plate 13 on the upper side of the image display module is disposed at the upper surface of the character display module. FIG. 30 presents an example in which a single glass substrate 62 is used for dual purposes, i.e., as a glass substrate on the upper side of the image display module (organic EL module) and also as a glass substrate on the lower side of the character display module.

By allowing the two display modules to share a single glass substrate in this manner, a reduction in the number of required parts and a lower profile are achieved while assuring advantages similar to those described earlier.

It is to be noted that while the display element at the character display module is constituted with a cholesteric liquid crystal in the explanation given above, the display element may instead be constituted with a PN (polymer network) liquid crystal. Since a PN liquid crystal is also used to provide display by setting the individual pixels in either a transmitting state or a reflecting state, it can be used in applications similar to those explained above. Since the PN liquid crystal does not have a memory retention property, power must be continuously supplied in order to sustain the display. However, since no light is emitted, the power consumption can be kept at an absolute minimum, and thus, better power efficiency is assured compared to the power requirement for a system in which all displays are provided through an image display module.

Moreover, since the reflected light at the PN liquid crystal is white light, black-and-white displays can be provided via the PN liquid crystal. In other words, instead of the yellow display explained earlier in reference to the cholesteric liquid crystal, a white color display (white characters or a white background) achieving a higher contrast can be provided.

While the present invention is adopted in electronic devices (electronic instruments) such as a PDA, a digital camera and a portable telephone in the embodiments described above, it may be adopted with equal effectiveness in other types of electronic devices, e.g., various portable devices including Electronic Books, mobile personal computers and the like.

While the invention has been particularly shown and described with respect to preferred embodiments and variations thereof by referring to the attached drawings, the present invention is not limited to these examples and it will be understood by those skilled in the art that various changes in form and detail may be made therein without departing from the spirit, scope and teaching of the invention.

The disclosures of the following priority applications are herein incorporated by reference:
Japanese Patent Application No. 2004-320096 filed Nov. 4, 2004
Japanese Patent Application No. 2005-017882 filed Jan. 26, 2005
Japanese Patent Application No. 2005-058593 filed Mar. 3, 2005.

The invention claimed is:

1. A display device comprising:
a first display unit that provides a light emitting display by individually controlling a light emitting quantity for each pixel;
a second display unit that allows either a transmitting state for transmitting light or a reflecting state for reflecting light to be selected in correspondence to each pixel and brings up a display by assuming a specific combination of a transmitting area and a reflecting area, and
a display control unit that controls display at the first display unit and display at the second display unit, wherein:
a display element of the second display unit has a memory function, and
the second display unit is layered over the first display unit so that the first display unit can be viewed through the transmitting area at the second display unit; and
the display control unit sequentially
(1) issues a drawing instruction for the first display unit and also issues an instruction for the second display unit to set at least pixels corresponding to a drawing area at the first display unit in the transmitting state at the second display unit,
(2) issues a drawing instruction for the second display unit with identical contents to those in the drawing instruction for the first display unit except for at least a display color, and also issues an instruction for the first display unit to draw a specific color at pixels at the first display unit corresponding to a drawing area at the second display unit in synchronization with a drawing speed at the second display unit, after drawing at the first display unit, and
(3) stops display control on at least the first display unit after drawing at the second display unit ends.

2. A display device according to claim 1, further comprising:
an illuminating unit that illuminates the first display unit, wherein:
the display control stop includes turning off the illuminating unit.

3. A display device according to claim 1, wherein:
the first display unit includes a light generating display element, wherein:
the display control stop includes cutting off power to the first display unit.

4. A display device according to claim 1, wherein:
in case that characters are displayed on the display device, the display control unit
(1) issues a drawing instruction for the first display unit and also issues an instruction for the second display unit to set at least pixels corresponding to a drawing area at the first display unit in the transmitting state at the second display unit,
(2) issues a drawing instruction for the second display unit with identical contents to those in the drawing instruction for the first display unit except for at least a display color, and also issues an instruction for the first display unit to draw a specific color at pixels at the first display unit corresponding to a drawing area at the second display unit in synchronization with a drawing speed at the second display unit, and
(3) stops display control on at least the first display unit after drawing at the second display unit ends.

5. A display device according to claim 1, wherein:
in case that characters which are already displayed on the second display unit are updated, the display control unit
(1) issues a drawing instruction for the first display unit and also issues an instruction for the second display unit to set at least pixels corresponding to a drawing area at the first display unit in the transmitting state at the second display unit,
(2) issues a drawing instruction for the second display unit with identical contents to those in the drawing instruction for the first display unit except for at least a display color, and also issues an instruction for the first display unit to draw a specific color at pixels at the first display unit corresponding to a drawing area at the second display unit in synchronization with a drawing speed at the second display unit, and
(3) stops display control on at least the first display unit after drawing at the second display unit ends.

6. A display device according to claim 1, wherein:
in case that an image is displayed on the display device, the display control unit issues a drawing instruction for the first display unit and also issues an instruction for the second display unit to set at least pixels corresponding to a drawing area at the first display unit in the transmitting state at the second display unit, and maintains a display of the drawing instruction on the first display unit.

7. A display device according to claim 1, wherein:
the display control unit turns off driving of the first display unit and supplying a power to the first display unit after drawing at the second display unit ends.

8. A display device according to claim 7, wherein:
the display control unit turns off driving of the second display unit and supplying a power to the second display unit after drawing at the second display unit ends.

9. A display device according to claim 1, wherein:
the specific color is a color that the first display unit looks when a power supply of the first display unit is turned off.

10. A display device comprising:
a first display unit that provides a light emitting display by individually controlling a light emitting quantity for each pixel;
a second display unit that allows either a transmitting state for transmitting light or a reflecting state for reflecting light to be selected in correspondence to each pixel and brings up a display by assuming a specific combination of a transmitting area and a reflecting area, and a display control unit that controls display at the first display unit and display at the second display unit, wherein:

a display element of the second display unit has a memory function, and the second display unit is layered over the first display unit so that the first display unit can be viewed through the transmitting area at the second display unit; and the display control unit sequentially (1) issues a drawing instruction for the first display unit and also issues an instruction for the second display unit to set at least pixels corresponding to a drawing area at the first display unit in the transmitting state at the second display unit, (2) issues a drawing instruction for the second display unit with identical contents to those in the drawing instruction for the first display unit, after drawing at the first display unit, and (3) stops display control on at least the first display unit after drawing at the second display unit ends.

11. A display device according to claim 10, wherein:
the first display unit includes a liquid crystal element constituting a display element thereof and provides the light emitting display by using a backlight.

12. A display device according to claim 10, wherein:
the first display unit includes an electroluminescence element constituting a display element thereof.

13. A display device according to claim 10, wherein:
the first display unit provides a color display.

14. A display device according to claim 10, wherein:
the second display unit includes a cholesteric liquid crystal element constituting a display element thereof.

15. A display device according to claim 10, wherein:
the second display unit includes a polymer network liquid crystal constituting a display element thereof.

16. A display device according to claim 10, wherein:
the first display unit includes an active drive-type display element;

the second display unit includes a passive drive-type display element; and drawing speed at the second display unit is lower than the drawing speed at the first display unit.

17. A display device according to claim 10, wherein:
in case that characters are displayed on the display device, the display control unit (1) issues a drawing instruction for the first display unit and also issues an instruction for the second display unit to set a least pixels corresponding to a drawing area at the first display unit in the transmitting state at the second display unit, (2) issues a drawing instruction for the second display unit with identical contents to those in the drawing instruction for the first display unit, and (3) stops display control on at least the first display unit after drawing at the second display unit ends.

18. A display device according to claim 10, wherein:
in case that characters which are already displayed on the second display unit are updated, the display control unit (1) issues a drawing instruction for the first display unit and also issues an instruction for the second display unit to set a least pixels corresponding to a drawing area at the first display unit in the transmitting state at the second display unit, (2) issues a drawing instruction for the second display unit with identical contents to those in the drawing instruction for the first display unit, and (3) stops display control on at least the first display unit after drawing at the second display unit ends.

19. A display device according to claim 10, wherein:
in case that an image is displayed on the display device, the display control unit issues a drawing instruction for the first display unit and also issues an instruction for the second display unit to set at least pixels corresponding to a drawing area at the first display unit in the transmitting state at the second display unit, and maintains a display of the drawing instruction on the first display unit.

20. A display device according to claim 10, wherein:
the display control unit turns off driving of the first display unit and supplying power to the first display unit after drawing at the second display unit ends.

* * * * *